United States Patent
Il et al.

(10) Patent No.: US 9,568,315 B2
(45) Date of Patent: Feb. 14, 2017

(54) DETECTION DEVICE, SENSOR, ELECTRONIC APPARATUS AND MOVING OBJECT

(71) Applicant: Seiko Epson Corporation, Tokyo (JP)

(72) Inventors: Naoki Il, Suwa (JP); Katsuhiko Maki, Chino (JP); Takashi Kurashina, Matsumoto (JP)

(73) Assignee: Seiko Epson Corporation (JP)

( * ) Notice: Subject to any disclaimer, the term of this patent is extended or adjusted under 35 U.S.C. 154(b) by 240 days.

(21) Appl. No.: 14/564,554

(22) Filed: Dec. 9, 2014

(65) Prior Publication Data
US 2015/0160012 A1    Jun. 11, 2015

(30) Foreign Application Priority Data

Dec. 10, 2013    (JP) .................................. 2013-255325

(51) Int. Cl.
*G01C 19/00*    (2013.01)
*G01C 19/5776*    (2012.01)
(Continued)

(52) U.S. Cl.
CPC ....... *G01C 19/5776* (2013.01); *G01C 19/5614* (2013.01); *G01D 5/12* (2013.01);
(Continued)

(58) Field of Classification Search
CPC . G01C 19/5776; G01C 19/5614; H03L 7/097; H03L 7/0816; G01D 5/12; H03B 5/364
See application file for complete search history.

(56) References Cited

U.S. PATENT DOCUMENTS 6,208,183 B1    3/2001 Li et al.
6,212,126 B1 *  4/2001 Sakamoto ................ G11C 7/22
                                                          365/194

(Continued)

FOREIGN PATENT DOCUMENTS

JP        2009-281888 A    12/2009
JP        2012-163477 A     8/2012
(Continued)

OTHER PUBLICATIONS

Extended European Search Report for Application No. EP 14 19 6929 dated Sep. 22, 2015 (9 pages).

*Primary Examiner* — Harshad R Patel
*Assistant Examiner* — Samir M Shah
(74) *Attorney, Agent, or Firm* — Harness, Dickey & Pierce, P.L.C.

(57) ABSTRACT

A detection device includes a drive circuit of a physical quantity transducer, a synchronization signal output circuit, and a detection circuit that performs detection of a physical quantity signal based on a physical quantity. The synchronization signal output circuit includes a delay locked loop (DLL) circuit that includes: a delay control circuit that outputs a delay control signal and a delay circuit that includes a plurality of delay units in which a delay time is controlled by the delay control signal; an adjustment circuit that includes at least one delay unit in which a delay time is controlled by the delay control signal, and outputs a signal obtained by delaying an input signal based on the output signal from the drive circuit to the DLL circuit; and an output circuit that outputs the synchronization signal based on multi-phase clock signals from the DLL circuit.

18 Claims, 20 Drawing Sheets

(51) Int. Cl.
*G01D 5/12* (2006.01)
*G01C 19/5614* (2012.01)
*H03B 5/36* (2006.01)
*H03L 7/081* (2006.01)

(52) U.S. Cl.
CPC ........... *H03B 5/364* (2013.01); *H03L 7/0814* (2013.01); *H03L 7/0816* (2013.01)

(56) References Cited

U.S. PATENT DOCUMENTS

| | | | | |
|---|---|---|---|---|
| 7,009,434 B2* | 3/2006 | Lee | ............... | G11C 7/22 327/158 |
| 7,236,028 B1* | 6/2007 | Choi | ............... | H03L 7/0812 327/149 |
| 7,576,579 B2* | 8/2009 | Fujisawa | ............... | H03L 7/0812 327/149 |
| 7,804,344 B2* | 9/2010 | Ma | ............... | G11C 7/22 327/147 |
| 7,825,711 B2* | 11/2010 | Ma | ............... | H03L 7/07 327/149 |
| 8,310,886 B2* | 11/2012 | Rhee | ............... | G11C 7/02 327/291 |
| 8,482,275 B2 | 7/2013 | Soramoto et al. | | |
| 2004/0222831 A1* | 11/2004 | Mitsumoto | ............... | H03L 7/0805 327/157 |
| 2005/0017810 A1 | 1/2005 | Lin | | |
| 2007/0086267 A1* | 4/2007 | Kwak | ............... | G11C 7/02 365/233.1 |
| 2007/0096784 A1* | 5/2007 | Hasegawa | ............... | H03L 7/07 327/158 |
| 2007/0273416 A1* | 11/2007 | Heyne | ............... | H03L 7/07 327/158 |
| 2008/0054959 A1* | 3/2008 | Fujisawa | ............... | H03L 7/0812 327/149 |
| 2010/0090736 A1* | 4/2010 | Kim | ............... | H03L 7/07 327/158 |
| 2010/0103746 A1* | 4/2010 | Ma | ............... | G11C 7/1066 365/189.05 |
| 2010/0123498 A1* | 5/2010 | Bae | ............... | H03L 7/07 327/158 |
| 2011/0179868 A1* | 7/2011 | Kaino | ............... | G01C 19/5607 73/504.12 |
| 2013/0176063 A1* | 7/2013 | Mizutani | ............... | H03L 7/24 327/161 |
| 2013/0214835 A1* | 8/2013 | Uo | ............... | H03L 7/0816 327/157 |

FOREIGN PATENT DOCUMENTS

| | | | | |
|---|---|---|---|---|
| JP | EP 2884228 A3 * | 10/2015 | ......... | G01C 19/5776 |
| KR | 20100041197 A * | 4/2010 | ............... | H03L 7/07 |

* cited by examiner

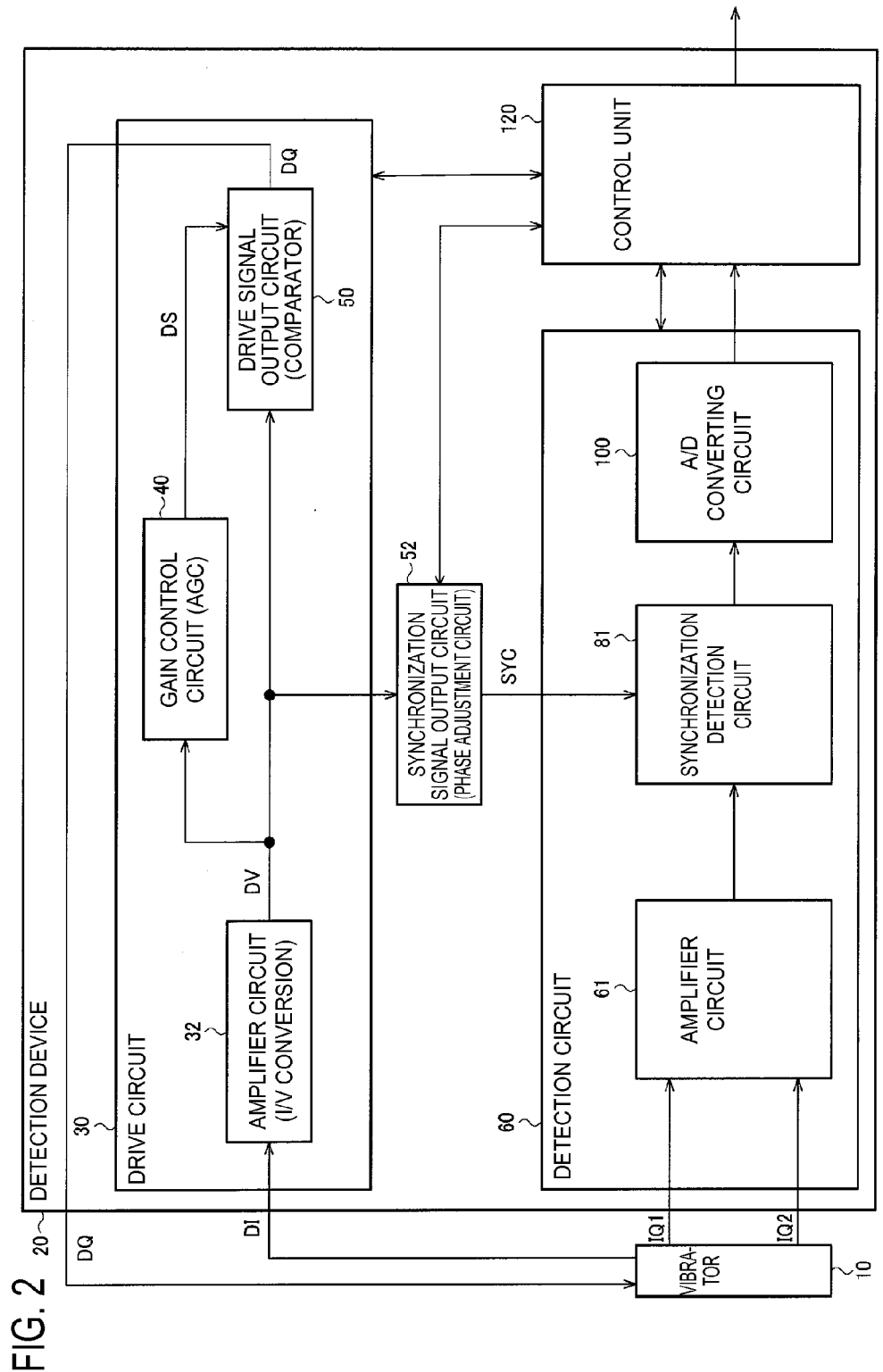

DETECTION DEVICE, SENSOR, ELECTRONIC APPARATUS AND MOVING OBJECT

BACKGROUND

1. Technical Field

The present invention relates to a detection device, a sensor, an electronic apparatus, a moving object and the like.

2. Related Art

A gyro sensor for detecting a physical quantity that changes due to external factors is used in electronic apparatuses such as a digital camera or a smart phone, or a moving object such as a vehicle or an airplane. The gyro sensor detects a physical quantity such as an angular velocity, and is used for image stabilization, posture control, GPS autonomous navigation or the like.

For example, a vibration gyro sensor such as a quartz crystal piezoelectric vibration gyro sensor is known as one of the gyro sensors. In the vibration gyro sensor, a physical quantity corresponding to a Coriolis force generated by rotation is detected.

In such a gyro sensor detection device, a synchronization detection circuit for removal of an unnecessary signal is often provided. In order to perform appropriate synchronization detection, it is necessary to appropriately adjust the phase relationship between a detection signal from a vibrator and a synchronization signal (reference signal or detection signal) used in the synchronization detection circuit. As a related art technique relating to such phase adjustment, for example, techniques disclosed in JP-A-2012-163477 and JP-A-2009-281888 are known.

For example, JP-A-2012-163477 discloses a technique in which a phase adjustment circuit configured by a phase locked loop (PLL) circuit is provided to perform synchronization signal phase adjustment. JP-A-2009-281888 discloses a technique in which a phase adjustment circuit configured by a delay locked loop (DLL) circuit is provided to perform synchronization signal phase adjustment.

However, in the technique of JP-A-2012-163477 in which the phase adjustment circuit is configured by the PLL circuit, for example, there are problems in that power consumption increases or the size of the circuit increases.

Further, in the technique of JP-A-2009-281888 in which the phase adjustment circuit is configured by the DLL circuit, in order to realize fine phase adjustment, it is necessary to provide a delay circuit in which plural delay units with a small phase adjustment amount (for example, 0.5 degrees) are serially connected. Accordingly, the number of the delay units increases, which increases the size of the delay circuit. Also, when a selector that selects a synchronization signal from multi-phase clock signals from the DLL circuit is provided, the circuit area of the selector increases, and the area of an interconnect region of the signal lines that connect the DLL circuit to the selector increases, which increases the size of the detection device.

SUMMARY

An advantage of some aspects of the invention is to provide a detection device, a sensor, an electronic apparatus, a moving object, and the like capable of realizing fine adjustment or coarse adjustment of synchronization signals with a small circuit configuration.

An aspect of the invention relates to a detection device including: a drive circuit that receives a feedback signal from a physical quantity transducer and drives the physical quantity transducer; a synchronization signal output circuit that receives an output signal from the drive circuit and outputs a synchronization signal; and a detection circuit that performs detection of a physical quantity signal corresponding to a physical quantity based on a signal from the physical quantity transducer and the synchronization signal and outputs detection data. The synchronization signal output circuit includes a delay locked loop (DLL) circuit that includes a delay control circuit that outputs a delay control signal, and a delay circuit that includes a plurality of delay units in which a delay time is controlled by the delay control signal, an adjustment circuit that includes at least one delay unit in which a delay time is controlled by the delay control signal, and outputs a signal obtained by delaying an input signal based on the output signal from the drive circuit to the DLL circuit, and an output circuit that outputs the synchronization signal based on multi-phase clock signals from the DLL circuit.

According to this aspect of the invention, the synchronization signal output circuit outputs the synchronization signal, and the detection circuit performs the detection of the physical quantity signal using the synchronization signal. The synchronization signal output circuit includes the DLL circuit that includes the delay control circuit and the delay circuit, the output circuit, and the adjustment circuit. Further, the adjustment circuit includes the delay unit in which the delay time is controlled based on the delay control signal for the delay units of the DLL circuit, and outputs the signal in which the input signal based on the output signal from the drive circuit is delayed to the DLL circuit. Accordingly, when the DLL circuit locks the delay time, the input signal is delayed by the delay unit of the adjustment circuit during the delay time based on the delay control signal, and is then input to the DLL circuit. Thus, fine phase adjustment or coarse phase adjustment of the synchronization signal can be performed, for example.

In the aspect of the invention, the adjustment circuit may include a second delay circuit configured by a delay unit having a delay time shorter than that of the delay unit that forms the delay circuit of the DLL circuit.

With such a configuration, fine phase adjustment of the synchronization signal can be performed, and high resolution phase adjustment can be performed, for example.

In the aspect of the invention, the adjustment circuit may include a third delay circuit configured by delay units of a number smaller than the number of the delay units that form the delay circuit of the DLL circuit.

With such a configuration, coarse phase adjustment of the synchronization signal can be performed, and wide range phase adjustment can be performed, for example.

In the aspect of the invention, when m and n are integers larger than 1 where m is smaller than n, the output circuit may output the synchronization signal based on m multi-phase clock signals among n multi-phase clock signals from the DLL circuit.

With such a configuration, it is possible to prevent an increase of the circuit size due to an interconnect region or the like of the multi-phase clock signals.

In the aspect of the invention, the output circuit may include a first selector that receives a first multi-phase clock signal group among the multi-phase clock signals from the DLL circuit and outputs a first signal, a second selector that receives a second multi-phase clock signal group among the multi-phase clock signals from the DLL circuit and outputs a second signal, and a third selector that receives the first signal and the second signal and outputs the synchronization signal.

With such a configuration, it is possible to adjust the phase in an adjustment range corresponding to the first multi-phase clock signal group or the second multi-phase clock signal group, to thereby realize wide range phase adjustment, for example.

In the aspect of the invention, the output circuit may include a first selector that receives a first multi-phase clock signal group among the multi-phase clock signals from the DLL circuit and outputs a first signal, a second selector that receives a second multi-phase clock signal group among the multi-phase clock signals from the DLL circuit and outputs a second signal, and a waveform shaping circuit that outputs the synchronization signal in which a falling edge is set by the first signal and a rising edge is set by the second signal.

With such a configuration, it is possible to adjust the duty ratio of the synchronization signal, for example, and to enhance detection performance of the detection device by making the duty ratio to be close to 50%, for example.

In the aspect of the invention, the output circuit may further include a third selector that receives a third multi-phase clock signal group among the multi-phase clock signals from the DLL circuit and outputs a third signal, a fourth selector that receives a fourth multi-phase clock signal group among the multi-phase clock signals from the DLL circuit and outputs a fourth signal, and a second waveform shaping circuit that outputs a second synchronization signal in which a falling edge is set by the third signal and a rising edge is set by the fourth signal.

With such a configuration, the second synchronization signal in which the duty ratio is adjusted, for example, can be simultaneously output, in addition to the synchronization signal in which the duty ratio is adjusted, for example.

In the aspect of the invention, the delay control circuit may compare phases of an input signal and an output signal of the DLL circuit to generate the delay control signal.

By performing the phase comparison, it is possible to lock the delay time using the DLL circuit.

In the aspect of the invention, when n and j are integers larger than 1 where j is smaller than n, the delay control circuit may perform phase comparison of j multi-phase clock signals among n multi-phase clock signals of the DLL circuit to generate the delay control signal.

By performing the phase comparison, it is possible to lock the delay time using the DLL circuit, and to prevent generation of pseudo locking, for example.

In the aspect of the invention, each delay unit that forms the DLL circuit and the adjustment circuit may be a differential type circuit having a differential input and a differential output.

With such a configuration, it is possible to prevent a situation that the lock function of the DLL circuit does not properly work due to variation or the like of a manufacturing process.

Another aspect of the invention relates to a detection device including: a drive circuit that receives a feedback signal from a physical quantity transducer and drives the physical quantity transducer; a synchronization signal output circuit that receives an output signal from the drive circuit and outputs a synchronization signal; and a detection circuit that performs detection of a physical quantity signal corresponding to a physical quantity based on a signal from the physical quantity transducer and the synchronization signal and outputs detection data. The synchronization signal output circuit includes a delay locked loop (DLL) circuit that includes a delay control circuit that outputs a delay control signal, and a delay circuit that includes a plurality of delay units in which a delay time is controlled by the delay control signal, an adjustment circuit that includes at least one delay unit in which a delay time is controlled by the delay control signal, is provided outside a loop of the DLL circuit, and adjusts a phase of the synchronization signal, and an output circuit that outputs the synchronization signal based on multi-phase clock signals from the DLL circuit.

According to this aspect of the invention, the synchronization signal output circuit outputs the synchronization signal, and the detection circuit performs the detection of the physical quantity signal using the synchronization signal. The synchronization signal output circuit includes the DLL circuit that includes the delay control circuit and the delay circuit, the output circuit, and the adjustment circuit. Further, the adjustment circuit is provided outside the loop of the DLL circuit, and adjusts a phase of the synchronization signal. Further, the adjustment circuit includes the delay unit in which the delay time is controlled based on the delay control signal for the delay units of the DLL circuit. Accordingly, when the DLL circuit locks the delay time, the delay time of the delay unit of the adjustment circuit is controlled by the delay control signal, and the phase of the synchronization signal is adjusted. Thus, fine phase adjustment or coarse phase adjustment of the synchronization signal can be performed, for example.

In the aspect of the invention, the drive circuit may be disposed between the synchronization signal output circuit and the detection circuit.

Still another aspect of the invention relates to a detection device including: a drive circuit that receives a feedback signal from a physical quantity transducer and drives the physical quantity transducer; a synchronization signal output circuit that receives an output signal from the drive circuit and outputs a synchronization signal; and a detection circuit that performs detection of a physical quantity signal corresponding to a physical quantity based on a signal from the physical quantity transducer and the synchronization signal and outputs detection data. The synchronization signal output circuit includes a delay locked loop (DLL) circuit that includes a delay control circuit that outputs a delay control signal, and a delay circuit that includes a plurality of delay units in which a delay time is controlled by the delay control signal, and an output circuit that outputs the synchronization signal based on multi-phase clock signals from the DLL circuit, and the drive circuit is disposed between the synchronization signal output circuit and the detection circuit.

According to this aspect of the invention, the synchronization signal output circuit outputs the synchronization signal using the output signal from the drive circuit, and the detection circuit performs the detection of the physical quantity signal using the synchronization signal. Further, the synchronization signal output circuit includes the DLL circuit and the output circuit, and the drive circuit is disposed between the synchronization signal output circuit and the detection circuit. With this configuration, it is possible to increase the distance between the synchronization signal output circuit and the detection circuit, and to prevent digital noise generated by the plural delay units of the DLL circuit of the synchronization signal output circuit from being transmitted to the detection circuit to deteriorate the detection performance.

In the aspect of the invention, when a direction orthogonal to a first direction is represented as a second direction and a direction opposite to the first direction is represented as a third direction, a first delay unit group among the plurality of delay units of the DLL circuit may be arranged so that a direction from an input side of each delay unit to an output side thereof is along the first direction, and a second delay unit group subsequent to the first delay unit group may be arranged on a second direction side of the first delay unit group, and may be arranged so that a direction from an input side of each delay unit to an output side thereof is along the third direction.

With such a configuration, it is possible to efficiently perform layout-arranging of the plural delay units of the DLL circuit. Further, for example, it is possible to adjust the width of the synchronization signal output circuit in the first direction by adjusting a bending point from the first delay unit group to the second delay unit group, for example, to thereby enhance the layout efficiency.

Yet another aspect of the invention relates to a sensor including the detection device described above; and the physical quantity transducer described above.

Still yet another aspect of the invention relates to an electronic apparatus including the detection device described above.

Further another aspect of the invention relates to a moving object including the detection device described above.

BRIEF DESCRIPTION OF THE DRAWINGS

Embodiments of the invention will be described with reference to the accompanying drawings, wherein like numbers reference like elements.

FIG. 2 is a diagram illustrating a detailed configuration example of the detection device.

DESCRIPTION OF EXEMPLARY EMBODIMENTS

Hereinafter, preferred embodiments of the invention will be described in detail. The embodiments to be described herein do not limit the content of the invention disclosed in the appended claims. Further, not all components described in the embodiments are essential components of the invention. For example, hereinafter, an example in which a physical quantity transducer is a piezoelectric vibrator (vibration gyroscope) and a sensor is a gyro sensor are described, but the invention is not limited thereto. For example, the invention may be applied to a vibrator (vibration gyroscope) of an electrostatic capacitance detection type formed of a silicon substrate or the like, a physical quantity transducer, a sensor or the like that detects a physical quantity equivalent to angular velocity information or a physical quantity other than the angular velocity information.

1. Electronic Apparatus, Gyro Sensor

Figure 1:
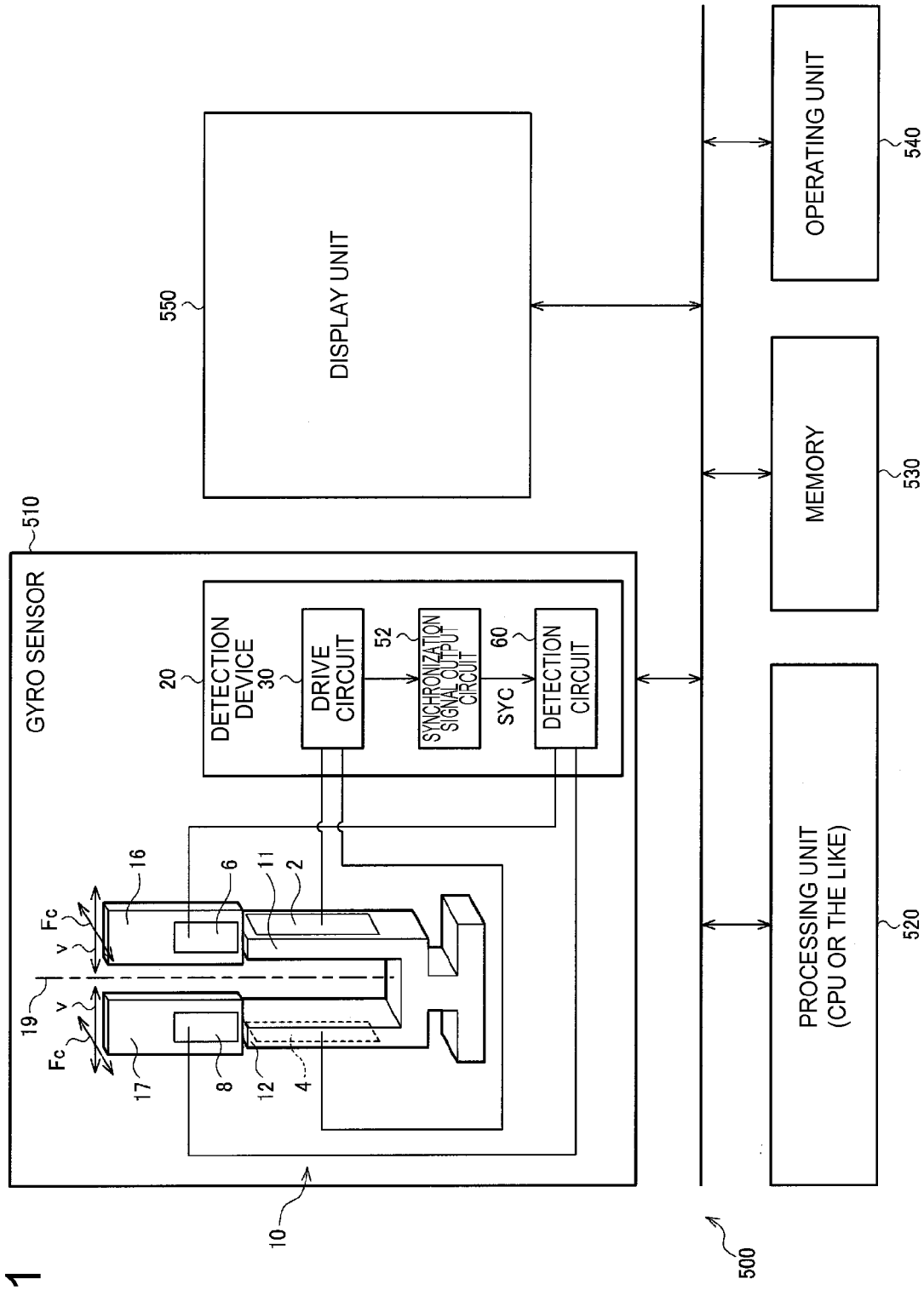
FIG. 1 is a diagram illustrating a configuration example of a detection device, an electronic apparatus, and a gyro sensor of an embodiment of the invention.

FIG. 1 shows a configuration example of a gyro sensor 510 (sensor in a broad sense) that includes a detection device of an embodiment of the invention, and an electronic apparatus 500 that includes the gyro sensor 510. The electronic apparatus 500 and the gyro sensor 510 are not limited to the configuration of FIG. 1, and various modifications such as an omission of a part of the components or an addition of other components may be made. Further, as the electronic apparatus 500 of the present embodiment, various devices such as a digital camera, a video camera, a smart phone, a portable phone, a car navigation system, a robot, a game machine, a clock, a health device, or a personal digital assistance may be used.

The electronic apparatus 500 includes the gyro sensor 510 and a processing unit 520. Further, the electronic apparatus 500 may include a memory 530, an operating unit 540, and a display unit 550. The processing unit 520 (CPU, MPU, processor or the like) controls the gyro sensor 510 or the like, or generally controls the electronic apparatus 500. Then, the processing unit 520 performs processing based on angular velocity information (physical quantity in a broad sense) detected by the gyro sensor 510. For example, the processing unit 520 performs processing for image stabilization, posture control or GPS autonomous navigation based on the angular velocity information. The memory 530 (ROM, RAM or the like) stores a control program or a variety of data, or functions as a work area or a data storage area. The operating unit 540 (keyboard, touchscreen or other input device) is provided to allow a user to operate the electronic apparatus 500, and the display unit 550 (LCD, LED or other display) displays a variety of information to the user.

The gyro sensor 510 (sensor) includes a vibrator 10, and a detection device 20. The vibrator 10 (physical quantity transducer in a broad sense) shown in FIG. 1 is a tuning fork type piezoelectric vibrator formed of a thin plate of a piezoelectric material such as a quartz crystal, and includes driving vibrators 11 and 12, and detecting vibrators 16 and 17. Drive terminals 2 and 4 are provided in the driving vibrators 11 and 12, and detecting terminals 6 and 8 are provided in the detecting vibrators 16 and 17.

The detection device 20 includes a drive circuit 30, a synchronization signal output circuit 52, and a detection circuit 60. The drive circuit 30 receives a feedback signal from the vibrator 10 to drive the vibrator 10. For example, the drive circuit 30 outputs a drive signal (drive voltage) to drive the vibrator 10. Further, the drive circuit 30 receives a feedback signal from the vibrator 10 to excite the vibrator 10.

The synchronization signal output circuit 52 receives a signal from the drive circuit 30, and outputs a synchronization signal SYC. For example, the synchronization signal output circuit 52 receives a signal after I/V conversion (current/voltage conversion) from an I/V converting circuit (amplifier circuit) included in the drive circuit 30. Further, the synchronization signal output circuit 52 outputs a signal obtained by adjusting the phase of the signal (binarized signal) to a synchronization detection circuit of the detection circuit 60 as the synchronization signal SYC.

The detection circuit 60 performs detection of a desired signal (physical quantity signal based on a physical quantity) based on a signal from the vibrator 10 and the synchronization signal SYC from the synchronization signal output circuit 52, and outputs detection data. For example, the detection circuit 60 receives a detection signal (detection current or electrical charges) from the vibrator 10 driven by the drive signal. Then, the detection circuit 60 performs synchronization detection using a synchronization signal with respect to the detection signal to detect (extract) a desired signal (Coriolis force signal) based on the physical quantity applied to the vibrator 10.

Specifically, an AC drive signal (drive voltage) from the drive circuit 30 is applied to the drive terminal 2 of the driving vibrator 11. Then, the driving vibrator 11 starts vibration by an inverse piezoelectric effect, and the driving vibrator 12 also starts vibration due to tuning fork vibration. Here, a current (electric charges) generated by a piezoelectric effect of the driving vibrator 12 is fed back to the drive circuit 30 as a feedback signal from the drive terminal 4. Thus, an oscillation loop including the vibrator 10 is formed.

If the driving vibrators 11 and 12 vibrate, the detecting vibrators 16 and 17 vibrate at a vibration velocity v in a direction shown in FIG. 1. Then, currents (electric charges) generated by a piezoelectric effect of the detecting vibrators 16 and 17 are output from the detection terminals 6 and 8 as detection signals (first and second detection signals). Then, the detection circuit 60 receives the detection signal from the vibrator 10 to detect a desired signal (desired wave) that is a signal based on a Coriolis force. That is, if the vibrator 10 (gyro sensor) rotates around a detection axis 19, the Coriolis force Fc is generated in a direction orthogonal to the vibration direction of the vibration velocity v. For example, when the angular velocity when the vibrator 10 rotates around the detection axis 19 is represented as $\omega$, the mass of the vibrator is represented as m, and the vibration velocity of the vibrator is represented as v, the Coriolis force is expressed as $Fc=2m \cdot v \cdot \omega$. Accordingly, the detection circuit 60 can detect the desired signal (physical quantity signal based on the physical quantity) that is a signal based on the Coriolis force (physical quantity in a broad sense), to thereby calculate the rotational angular velocity $\omega$ of the gyro sensor. By using the calculated angular velocity $\omega$, the processing unit 520 can perform a variety of processing for image stabilization, posture control, GPS autonomous navigation or the like.

FIG. 1 shows an example in which the vibrator 10 is a tuning fork type, but the vibrator 10 of the present embodiment is not limited to such a structure. For example, a T-shaped type, a double T-shaped type or the like may be used. Further, the piezoelectric material of the vibrator 10 may be formed of a material other than the quartz crystal.

2. Detection Device

FIG. 2 shows a detailed configuration example of the detection device 20 of the present embodiment.

The drive circuit 30 includes an amplifier circuit 32 to which a feedback signal DI from the vibrator 10 is input, a gain control circuit 40 that performs an automatic gain control, and a drive signal output circuit 50 that outputs a drive signal DQ to the vibrator 10. The drive circuit 30 is not limited to the configuration shown in FIG. 2, and various modifications such as an omission of a part of the components or an addition of other components may be made.

The amplifier circuit 32 (I/V converting circuit) amplifies the feedback signal DI from the vibrator 10. For example, the amplifier circuit 32 converts the current signal DI from the vibrator 10 into a voltage signal DV, and outputs the result. The amplifier circuit 32 may be realized by a capacitor, a resistance element, an operational amplifier, and the like.

The drive signal output circuit 50 outputs the drive signal DQ based on the signal DV subjected to the amplification in the amplifier circuit 32. For example, the drive signal output circuit 50 outputs a drive signal of a square wave (or a sine wave). The drive signal output circuit 50 may be realized by a comparator, and the like. Between the amplifier circuit 32 and the drive signal output circuit 50, for example, another circuit such as a filter unit (high pass filter or low pass filter) may be provided.

The gain control circuit 40 (AGC) outputs a control signal DS to the drive signal output circuit 50 to control the amplitude of the drive signal DQ. Specifically, the gain control circuit 40 monitors the signal DV to control the gain of the oscillation loop. For example, in the drive circuit 30, the amplitude of the drive voltage to be supplied to the vibrator 10 (driving vibrator) is constantly maintained in order to constantly maintain the sensitivity of the gyro sensor. For this reason, the gain control circuit 40 for automatically adjusting the gain is provided in the oscillation loop of a drive vibration system. The gain control circuit 40 variably and automatically adjusts the gain so that the amplitude (vibration velocity v of the vibrator) of the feedback signal DI from the vibrator 10 becomes constant.

The synchronization signal output circuit 52 receives the output signal DV subjected to the amplification (I/V conversion) in the amplifier circuit 32, and outputs the synchronization signal SYC (reference signal) to the detection circuit 60. For example, the synchronization signal output circuit 52 may include a binarizing circuit that performs binarization for the output signal DV of the sine wave (AC) to generate a square wave signal. The binarizing circuit may be realized by a comparator, and the like. Further, the synchronization signal output circuit 52 performs phase adjustment of the square wave signal subjected to the binarization to generate the synchronization signal SYC, and outputs the result to a synchronization detection circuit 81.

The detection circuit 60 includes an amplifier circuit 61, the synchronization detection circuit 81, and an A/D converting circuit 100. The amplifier circuit 61 receives first and second detection signals IQ1 and IQ2 from the vibrator 10, and performs signal amplification or electric charge-voltage conversion. The synchronization detection circuit 81 performs synchronization detection based on the synchronization signal SYC from the drive circuit 30. The A/D converting circuit 100 performs A/D conversion of the signal subjected to the synchronization detection.

A control unit 120 (controller) performs control of each circuit of the detection device 20, or performs digital signal processing such as digital filtering. For example, the control unit 120 outputs a control signal to the drive circuit 30, the synchronization signal output circuit 52, and the detection circuit 60 to control the circuits. Further, the control unit 120 performs digital filtering for unnecessary signal component removal or band restriction based on the digital signal from the A/D converting circuit 100.

3. Synchronization Detection

Next, the synchronization detection will be described with reference to schematic diagrams of FIGS. 3A to 3D. In reality, the amplitude of an unnecessary signal is extremely large compared with the amplitude of a desired signal (physical quantity signal based on the physical quantity), but for convenience of illustration, the amplitude of the unnecessary signal and the amplitude of the desired signal are made the same.

Figure 3A:
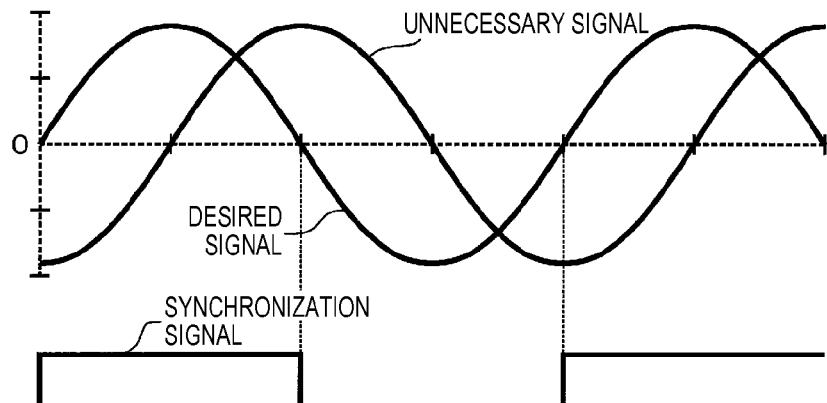
FIGS. 3A to 3D are diagrams illustrating synchronous detection.
Figure 3B:
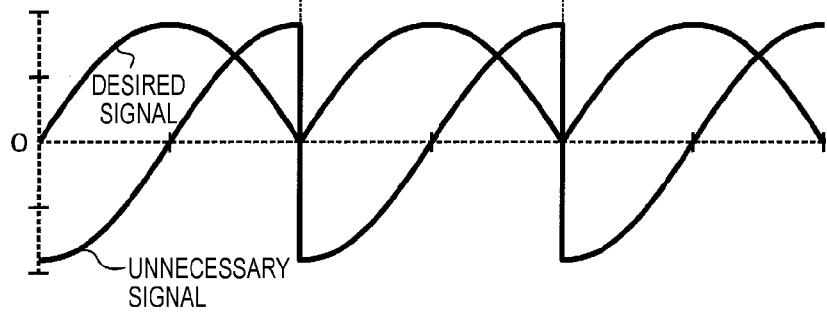

As shown in FIG. 3A, when the phase of the desired signal and the phase of the synchronization signal completely match each other, the desired signal and the unnecessary signal subjected to the synchronization detection are as shown in FIG. 3B. That is, the desired signal forms a full-wave rectified waveform, and the unnecessary signal forms a waveform in which the area of a positive portion and the area of a negative portion are the same. Accordingly, by performing smoothing by the low pass filter or the like arranged in the subsequent stage, a DC component of the desired signal is output as an output signal, and a component of the unnecessary signal does not appear in the output signal. By performing the synchronization detection in this way, an unnecessary signal such as mechanical vibration leakage having a phase difference of 90 degrees with respect to the desired signal can be removed.

Figure 3C:
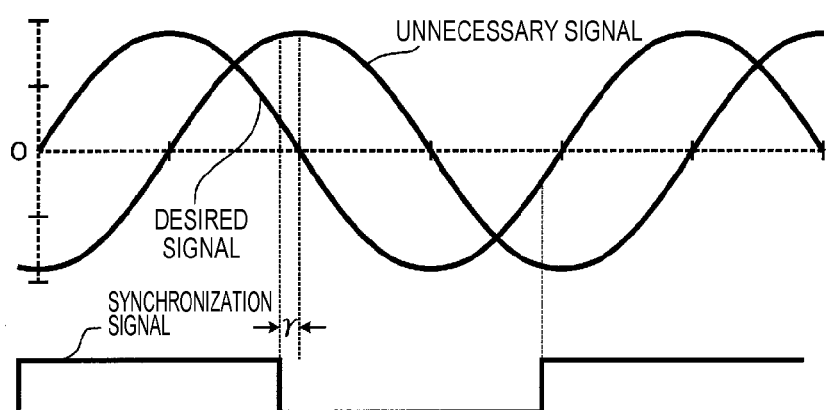
Figure 3D:
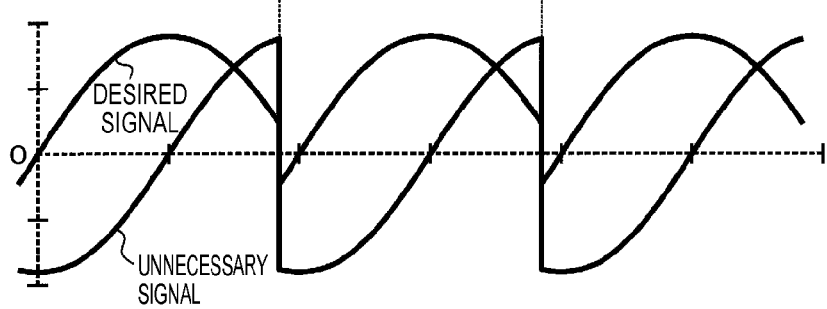

On the other hand, as shown in FIG. 3C, when the phase of the desired signal and the phase of the synchronization signal are deviated from each other by γ, the desired signal and the unnecessary signal subjected to the synchronization detection are as shown in FIG. 3D. That is, the desired signal does not form a complete full-wave rectified waveform, and includes a negative component. Further, the unnecessary signal does not form a waveform having the same area in the positive portion and the negative portion. Accordingly, in an output signal obtained by performing smoothing using the low pass filter or the like arranged in the subsequent stage, a DC component of the desired signal becomes small compared with the case of FIG. 3B, and a component of the unnecessary signal appears, which causes zero drift or the like.

In order to appropriately realize the above-described synchronization detection, a phase adjustment circuit that adjusts the phase relationship between the detection signal (desired signal) and the synchronization signal to become appropriate is desired.

Further, in order to increase the degree of freedom in evaluation, design or configuration of the detection device, it is preferable to realize phase adjustment (wide range phase adjustment) in a wide adjustment range (for example, about 180 degrees). For example, when evaluating the detection device, the phase relationship between the detection signal and the synchronization signal may be variously changed to evaluate the influence of a leakage signal on the detection performance or the like, which is preferable to enhance the convenience.

Further, in order to secure the detection efficiency with high accuracy, it is preferable to realize phase adjustment (high resolution phase adjustment) with a small phase adjustment amount (for example, about 0.5 degrees). For example, when manufacturing the detection device, the phase relationship between the detection signal and the synchronization signal may be finely adjusted to write phase adjustment data into a non-volatile memory or the like, to thereby enhance the detection performance when the detection device is actually operated.

In addition, in order to handle plural types of vibrators having different drive frequencies (vibration frequencies), it is preferable to handle operation frequencies of a wide range (wide range frequency handling). For example, it is preferable to realize detection and driving using the detection device having the same circuit configuration in either of a vibrator of a low drive frequency (for example, 50 kHz or lower) or a vibrator of a high drive frequency (for example, 200 kHz or greater).

Figure 4A:
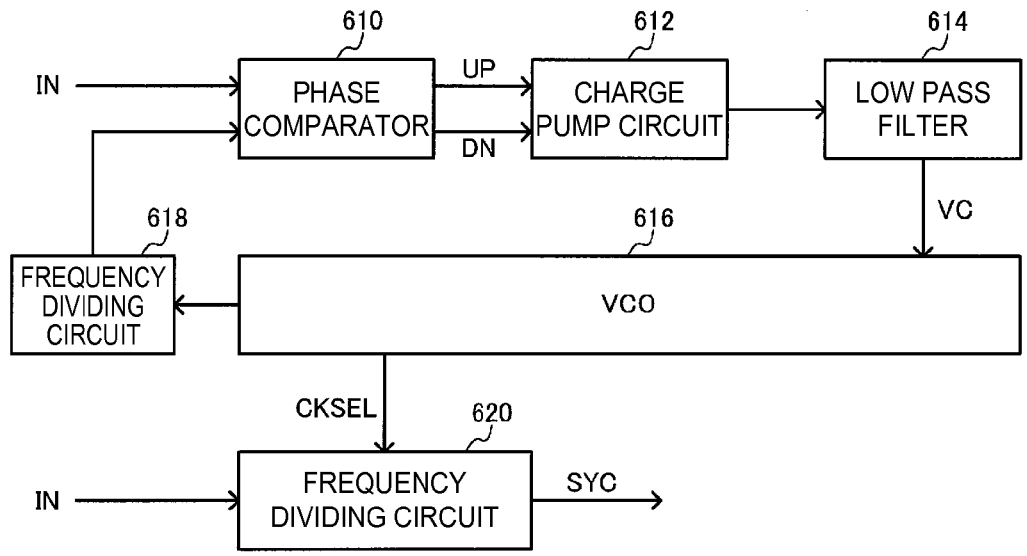
FIGS. 4A and 4B are diagrams illustrating comparative examples of the present embodiment.
Figure 4B:
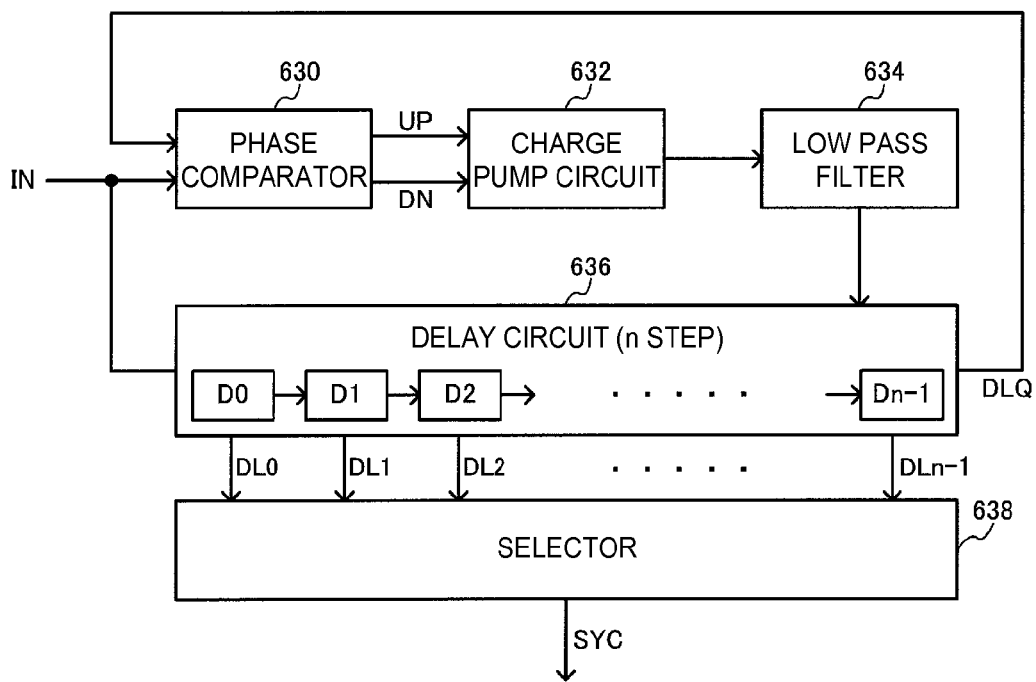

FIGS. 4A and 4B show examples of a phase adjustment circuit that is a comparative example of the present embodiment. FIG. 4A is an example of a phase adjustment circuit using a PLL circuit. The phase adjustment circuit includes a phase comparator 610, a charge pump circuit 612, a low pass filter 614, a voltage control oscillator (VCO) 616, and frequency dividers 618 and 620.

The VCO 616 receives a control voltage VC based on a result of phase comparison with an input signal IN, and performs oscillation at a frequency obtained by multiplying the frequency of the input signal IN (for example, 360 times or 720 times). Further, a clock signal CKSEL selected from multi-phase clock signals generated by the VCO 616 is output to the frequency divider 620. The frequency divider 620 outputs a signal obtained by shifting the phase of the input signal IN based on the input signal IN and the clock signal CKSEL as a synchronization signal SYC.

In the comparative example of FIG. 4A, since the VCO 616 performs the oscillation at the high frequency, electric power consumption becomes large. For example, when the frequency (drive frequency of the drive circuit) of the input signal IN is 100 kHz and the phase adjustment amount is set to a step of 1 degree, the VCO 616 should perform the oscillation at 36 MHz obtained by multiplying 100 KHz 360 times. When the phase adjustment amount is set to a step of 0.5 degrees, the VCO 616 should perform the oscillation at 72 MHz obtained by multiplying 100 KHz 720 times. Accordingly, in the comparative example of FIG. 4A, if the resolution of the phase adjustment amount increases, the electric power consumption becomes extremely large. Further, since the function of phase selection is performed in the frequency divider 620, the size of the circuit becomes large.

FIG. 4B shows an example of a phase adjustment circuit using a DLL circuit. The phase adjustment circuit includes a phase comparator 630, a charge pump circuit 632, a low pass filter 634, a delay circuit 636, and a selector 638.

In FIG. 4B, the delay circuit 636 that forms the DLL circuit includes n delay units D0 to Dn−1 that are serially connected. In the configuration of FIG. 4B, in order to set the phase adjustment amount to a step of 0.5 degrees, 720 (n=720) delay units are provided, and thus, the size of the circuit of the delay circuit 636 becomes large. That is, if the above-described phase adjustment of high resolution is realized, the size of the circuit becomes large. Further, in order to provide the wide range phase adjustment, for example, if the phase adjustment range is set to a wide range of 180 degrees, the selector 638 that selects a signal from 360 (n=360, or 720) multi-phase clock signals is provided, and thus, the size of the circuit of the selector 638 becomes large. Further, the interconnect area of a signal line that connects the delay circuit 636 to the selector 638 also becomes large, which causes an increase in the size of the phase adjustment circuit.

4. Synchronization Signal Output Circuit

Figure 5:
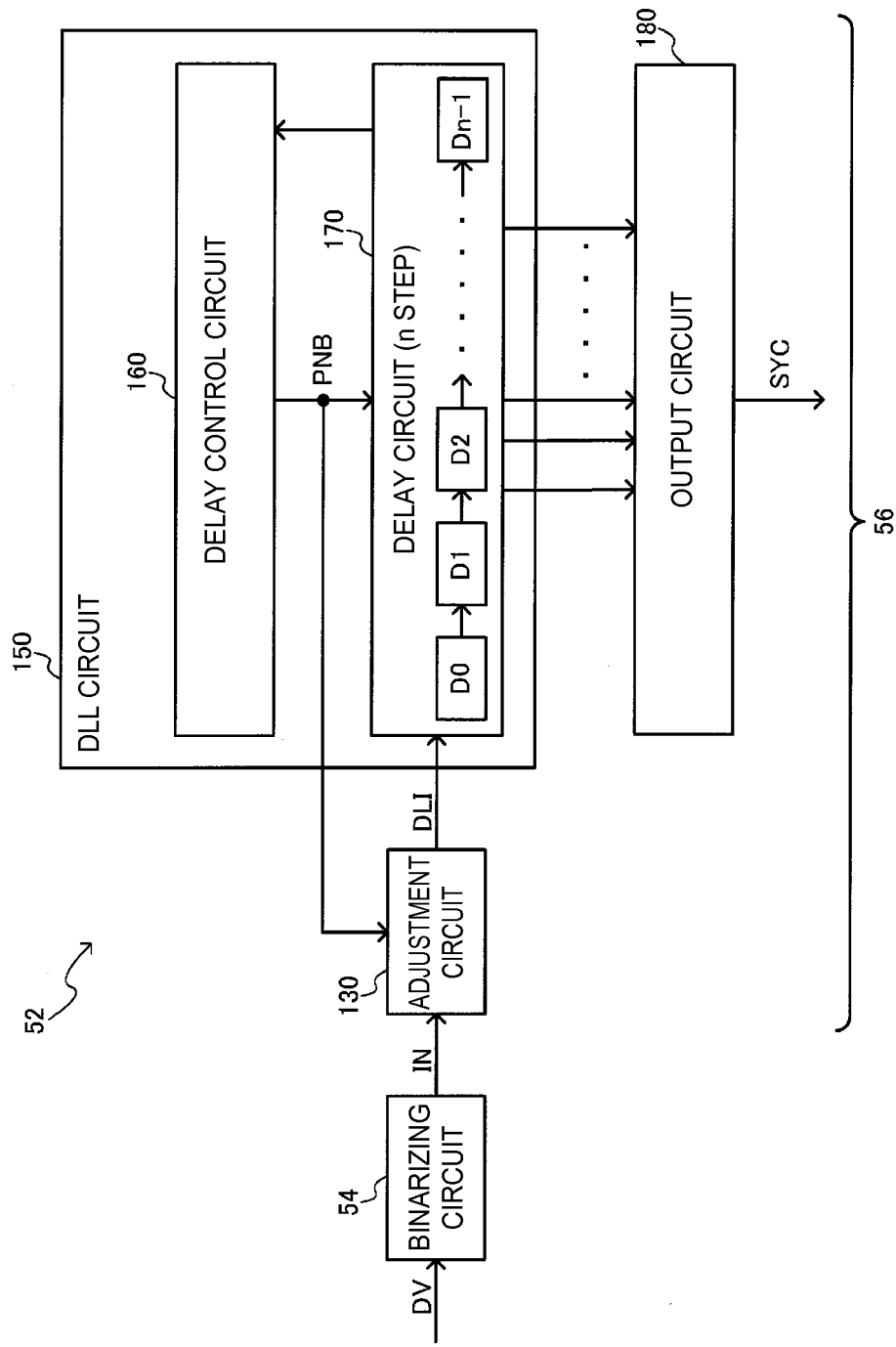
FIG. 5 is a diagram illustrating a basic configuration example of a synchronization signal output circuit of the present embodiment.

FIG. 5 shows a basic configuration example of the synchronization signal output circuit 52 of the present embodiment, configured to solve the above-described problems. The synchronization signal output circuit 52 includes an adjustment circuit 130, a delay locked loop (DLL) circuit 150, and an output circuit 180. Specifically, the synchronization signal output circuit 52 shown in FIG. 5 includes a binarization circuit 54 and a phase adjustment circuit 56, in which the phase adjustment circuit 56 is configured to have the adjustment circuit 130, the DLL circuit 150, and the output circuit 180. The synchronization signal output circuit 52 is not limited to the configuration shown in FIG. 5, and various modifications such as an omission of a part of the components or an addition of other components may be made.

The binarization circuit (waveform shaping circuit) 54 receives the output signal DV of the sine wave from the drive circuit 30, performs binarization (waveform shaping) of the output signal DV, and outputs the signal IN of the sine wave, for example. The binarization circuit 54 may be realized by a comparator that compares the output signal DV with a reference voltage (reference voltage of the drive signal) and outputs the signal IN, and the like, for example.

The output signal DV from the drive circuit 30 is a signal subjected to the I/V conversion (amplification) as shown in FIG. 2, and a signal obtained by performing filtering (high pass filter, low pass filter or the like) for the output signal DV may be input to the synchronization signal output circuit 52 (binarization circuit 54).

Further, the synchronization signal output circuit (phase adjustment circuit 56) of the present embodiment performs phase adjustment of the input signal IN, and outputs the signal subjected to the phase adjustment as the synchronization signal SYC.

Specifically, the DLL circuit 150 includes a delay control circuit 160 and a delay circuit 170. The delay control circuit 160 outputs a delay control signal PNB. For example, the delay control circuit 160 performs phase comparison based on a feedback signal from the DLL circuit 150 to generate the delay control signal PNB. A variety of processing may be performed as the phase comparison to be described later.

The delay circuit 170 includes plural delay units (delay circuits) D0 to Dn−1 (first to n-th delay units). The delay units D0 to Dn−1 are serially connected. For example, an output of the k-th (1≤k<n) delay unit Dk is input to the (k+1)-th delay unit Dk+1 at the subsequent stage, and an output of the (k+1)-th delay unit Dk+1 is input to the (k+2)-th delay unit Dk+2 at the subsequent stage.

In the delay units D0 to Dn−1, a delay time is controlled by the delay control signal PNB from the delay control circuit 160. For example, when the delay units D0 to Dn−1 are current control type inverter circuits, the delay control signal PNB is a signal for controlling a current (bias current) that flows in the inverter circuits. Further, if the current that flows in the inverter circuits increases, the delay time decreases, and if the current decreases, the delay time increases. In addition, as the signal from the delay circuit 170 is fed back to the delay control circuit 160, a loop of the DLL circuit 150 is formed, in which a DLL operation of locking the delay time of each of the delay units D0 to Dn−1 is performed. Specifically, the delay time of each of the delay units D0 to Dn−1 is locked so that a phase difference from the delay unit D0 to the delay unit Dn−1 becomes 360 degrees, for example.

The output circuit 180 outputs the synchronization signal SYC based on multi-phase clock signals from the DLL circuit 150. The multi-phase clock signals refer to clock signals of which the phases are sequentially shifted. For example, the first clock signal among the multi-phase clock signals is an output signal of the delay unit D0. Further, the second and third clock signals among the multi-phase clock signals are output signals of the delay units D1 and D2. In addition, the second clock signal has the phase shifted by the delay time of the delay unit D1 with respect to the first clock signal, and the third clock signal has the phase shifted by the delay time of the delay unit D2 with respect to the second clock signal.

The adjustment circuit 130 includes at least one delay unit in which the delay time is controlled by the delay control signal PNB. Further, the adjustment circuit 130 outputs a signal DLI obtained by delaying the input signal IN (for example, signal obtained by binarizing the output signal DV) based on the output signal DV from the drive circuit 30, to the DLL circuit 150. That is, the signal IN is delayed by the delay unit included in the adjustment circuit 130, and the delayed signal DLI is input to the DLL circuit 150.

Specifically, the adjustment circuit 130 includes delay units having the same configuration as the delay units D0 to Dn−1 of the delay circuit 170. Further, in the delay units of the adjustment circuit 130, a delay time is controlled by the delay control signal PNB, similar to the delay units D0 to Dn−1 of the DLL circuit 150. For example, when the delay units D0 to Dn−1 are configured by the current control type inverter circuit, the adjustment circuit 130 is similarly configured by a current control type inverter circuit having the same configuration. Further, an inverter circuit thereof controls the delay time by the delay control signal PNB, similar to the inverter circuit that forms the delay units D0 to Dn−1 of the DLL circuit 150. The delay time of the delay units of the adjustment circuit 130 may be set to be shorter or longer than the delay time of each of the delay units D0 to Dn−1 of the delay circuit 170.

According to the above-described synchronization signal output circuit 52 of the present embodiment, in the delay units of the adjustment circuit 130, the delay time is controlled using the delay control signal PNB used in the delay circuit 170 of the DLL circuit 150. Further, the signal DLI obtained by delaying the input signal IN by the delay units of the adjustment circuit 130 is input to the DLL circuit 150.

For example, the number of the delay units D0 to Dn−1 of the delay circuit 170 is 360 (n=360), and the delay time of each of the delay units D0 to Dn−1 is locked by the DLL circuit 150 so that the phase delay (phase shift amount) of one delay unit becomes 1 degree.

In this case, for example, if the delay units corresponding to half the delay time of each of the delay units D0 to Dn−1 of the delay circuit 170 are provided in the adjustment circuit 130, fine phase adjustment of a step of 0.5 degrees may be realized by the adjustment circuit 130. Further, for example, if 30 delay units controlled by the delay control signal PNB are provided in the adjustment circuit 130, coarse phase adjustment of a step of 30 degrees may be realized by the adjustment circuit 130. Accordingly, according to the present embodiment, it is possible to realize fine phase adjustment or coarse phase adjustment by a simple method of adding the adjustment circuit 130 in which the delay time is controlled by the delay control signal PNB.

Particularly, in the present embodiment, there is a characteristic that the adjustment circuit 130 is not included in the loop (delay time lock loop) of the DLL circuit 150. In this configuration, the phase adjustment amount (delay time) set by the delay control signal PNB is locked and fixed by the loop of the DLL circuit 150. For example, the number of steps of the delay units of the delay circuit 170 is set to 360, the phase adjustment amount set by the delay control signal PNB is set to 1 degree, and if the number of steps thereof is set to 180, the phase adjustment amount is set to 2 degrees. Further, since the adjustment circuit 130 is not included in the loop of the DLL circuit 150, even though the number of steps of the delay units in the adjustment circuit 130 increases or decreases, the phase adjustment amount set by the delay control signal PNB is not affected, and is not changed. Accordingly, it is possible to accurately realize fine phase adjustment or coarse phase adjustment by the setting of the number of steps of the delay units in the adjustment circuit 130 or the setting of the delay time of the delay units.

In addition, in the present embodiment, the output circuit 180 outputs the synchronization signal SYC based on m multi-phase clock signals among n multi-phase clock signals from the DLL circuit 150, for example. Here, m and n are integers larger than 1 where m is smaller than n (m<n).

That is, in the comparative example of FIG. 4B, all multi-phase clock signals DL0 to DLn−1 from the delay circuit 636 are input to the selector 638.

On the other hand, in the present embodiment of FIG. 5, only a part of the multi-phase clock signals among the n multi-phase clock signals generated by the delay units D0 to Dn−1 is input to the output circuit 180. Further, the output circuit 180 outputs the synchronization signal SYC using only part of the multi-phase clock signals.

With such a configuration, the circuit size of the output circuit 180 can be reduced compared with the cases shown in FIG. 4B. That is, when a selector is provided in the output circuit 180, according to the present embodiment, since the number (m) of signal lines that are selection targets of the selector is small, the circuit size of the selector can be reduced. Further, since the number of signal lines that connect the delay circuit 170 to the output circuit 180 is small, the interconnect area of the signal lines becomes small, and thus, the layout area of the circuit can be reduced.

In FIG. 5, the adjustment circuit 130 is provided at a preceding stage (input side) of the DLL circuit 150, but the present embodiment is not limited thereto, and various modifications may be made. For example, the adjustment circuit 130 may be provided at a subsequent stage (output side) of the DLL circuit 150. For example, the phase of the synchronization signal SYC may be adjusted (fine adjustment or coarse adjustment) by adjusting the phase of the signal in the output circuit 180 by the adjustment circuit 130. For example, the phase of the synchronization signal SYC may be adjusted by adjusting the phase of the output signal of the selector of the output circuit 180 to be described later by the adjustment circuit 130. In this way, the adjustment circuit 130 may be any circuit that includes at least one delay unit in which the delay time is controlled by the delay control signal PNB, is provided outside (outside the delay time lock) the loop of the DLL circuit 150, and adjusts the phase of the synchronization signal SYC. Further, the synchronization signal output circuit 52 of the present embodiment may be used as a phase adjustment circuit having an application other than the detection device 20 such as a gyro sensor 510.

5. First Configuration Example

Figure 6:
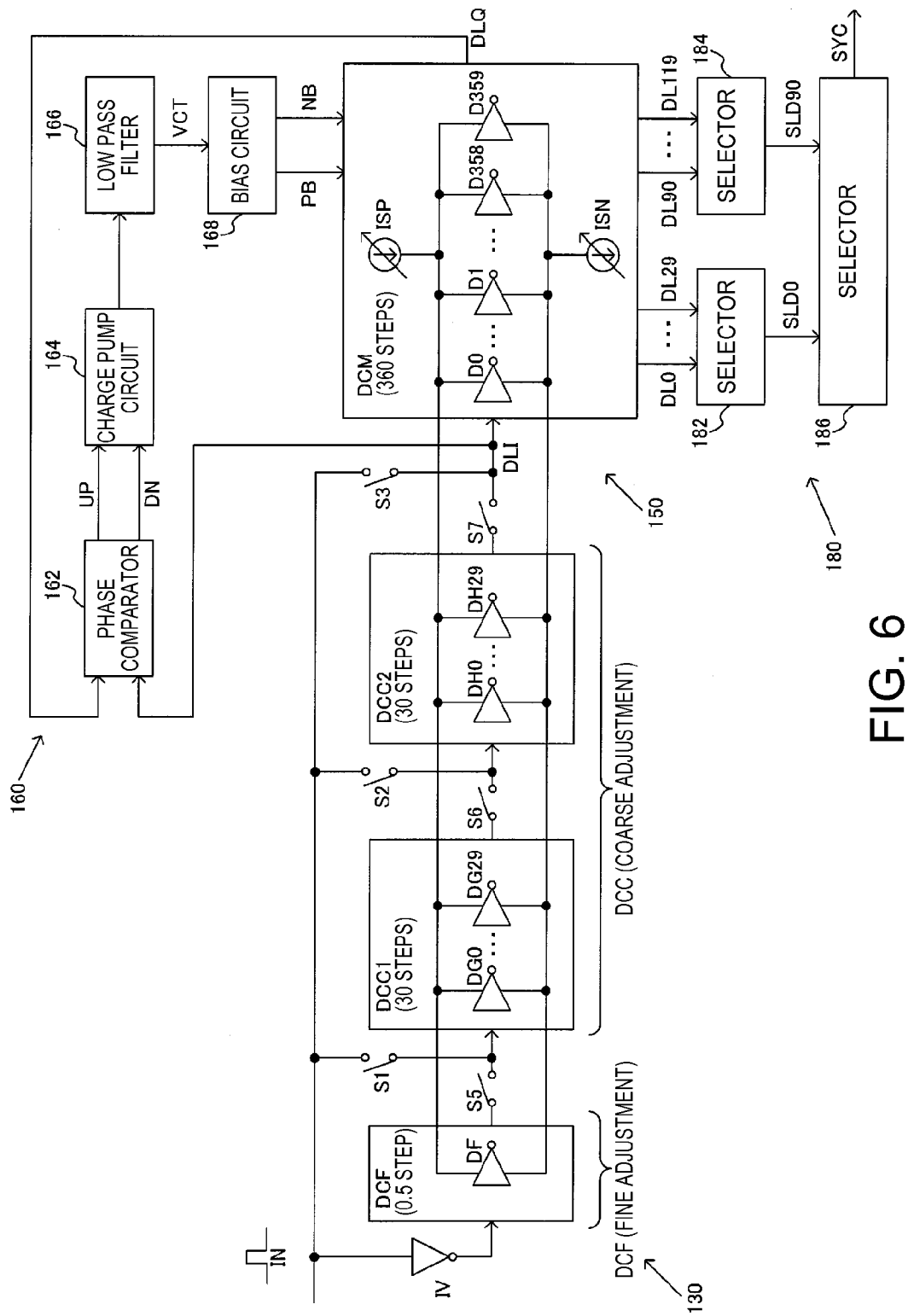
FIG. 6 is a diagram illustrating a detailed first configuration example of the synchronization signal output circuit.

FIG. 6 shows a detailed first configuration example of the synchronization signal output circuit 52 of the present embodiment. In FIG. 6, a delay circuit DCM includes 360 delay units D0 to D359 that are serially connected. The delay circuit DCM corresponds to the delay circuit 170 of the DLL circuit 150 of FIG. 5.

Figure 7:
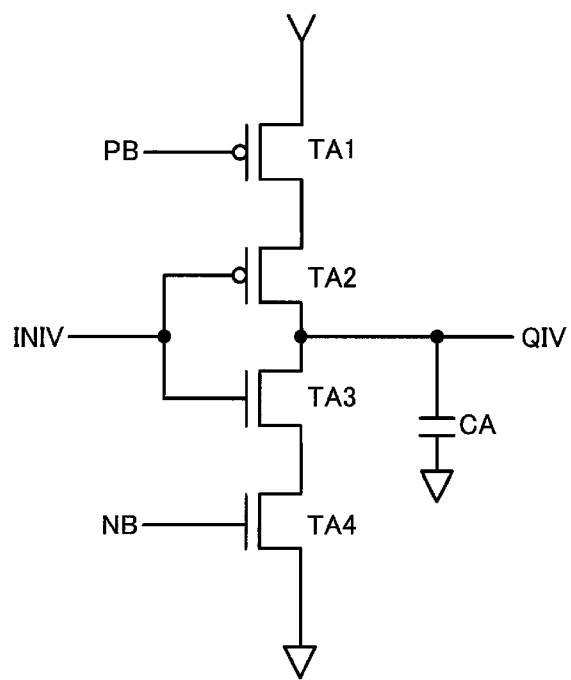
FIG. 7 is a diagram illustrating a configuration example of a current control type inverter circuit that is an example of a delay unit.

The delay units D0 to D359 are configured by a current control type inverter circuit in which a delay time is controlled by a bias current. FIG. 7 shows a configuration example of the current control type inverter circuit. The inverter circuit includes P-type transistors TA1 and TA2, and N-type transistors TA3 and TA4 that are serially connected between a high potential power source (VDD) and a low potential power source (VSS). An input signal INIV from an inverter circuit at a preceding state is input to gates of the transistors TA2 and TA3, and an output signal QIV to an inverter circuit at a subsequent stage is output from drains of the transistors TA2 and TA3. A delay control signal PB is input to a gate of the transistor TA1, and a delay control signal NB is input to a gate of the transistor TA4. A bias current that flows in the inverter circuit is controlled by the delay control signals PB and NB, and thus, the delay time is controlled. The delay time may be set by a capacitance value of a capacitor CA connected to the drains of the transistors TA2 and TA3, the transistor sizes (W/L) of the transistors TA1 and TA4, or the like. The capacitor CA may be a parasitic capacitance such as a drain capacitance.

In FIG. 6, the delay control circuit 160 performs phase comparison of the input signal DLI and the output signal DLQ of the DLL circuit 150 to generate the delay control signals PB and NB (corresponding to PNB in FIG. 5).

Specifically, the delay control circuit 160 includes a phase comparator 162, a charge pump circuit 164, a low pass filter 166, and a bias circuit 168. The phase comparator 162 compares the phase of the input signal DLI with the phase of the output signal DLQ of the DLL circuit 150 (delay circuit DCM), and outputs signals UP and DN that are phase comparison result signals. The charge pump circuit 164 performs a charge pumping operation based on the signals UP and DN from the phase comparator 162. Then, a control voltage VCT subjected to smoothing in the low pass filter 166 is output to the bias circuit 168. The bias circuit 168 generates and outputs the delay control signals (current control signals) PB and NB based on the control voltage VCT.

Figure 8A:
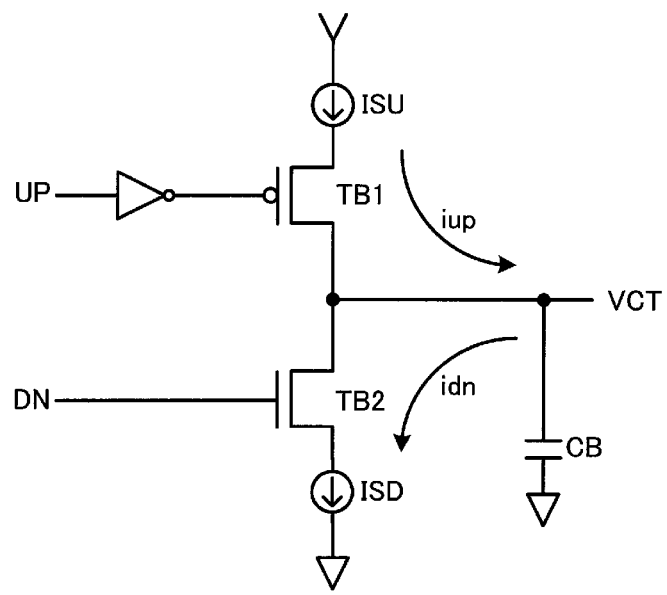
FIGS. 8A and 8B are diagrams illustrating configuration examples of a delay control circuit.

FIG. 8A shows a configuration example of the charge pump circuit 164 and the low pass filter 166. In FIG. 8A, if the signal UP becomes an H level (active), a current iup of a current source ISU flows through a transistor TB1 that is turned on to charge a capacitor CB. Thus, the control voltage VCT increases. Further, if the signal DN becomes an H level (active), a current idn of a current source ISD is discharged from the capacitor CB through a transistor TB2 that is turned on. Thus, the control voltage VCT decreases.

Figure 8B:
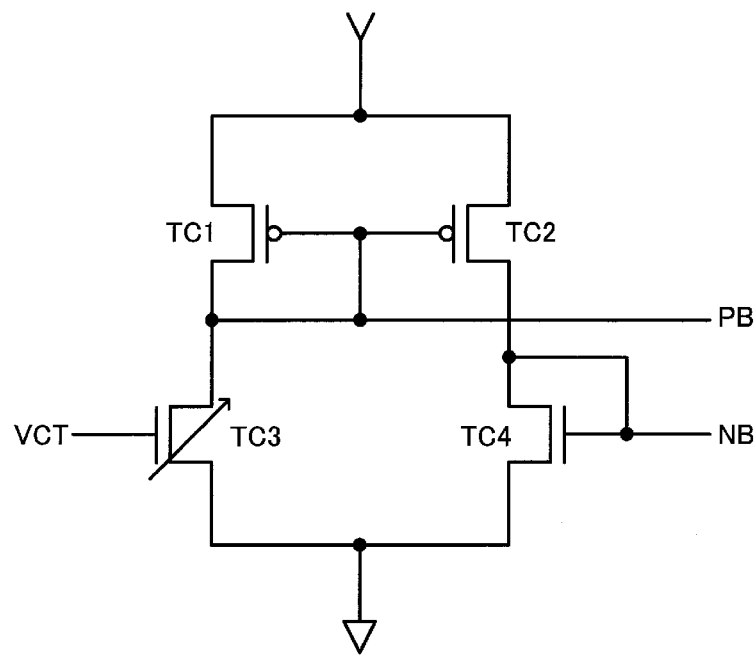

FIG. 8B shows a configuration example of the bias circuit 168. The bias circuit 168 includes P-type transistors TC1 and TC2 that form a current mirror circuit, and transistors TC3 and TC4 that are serially connected to the respective transistors TC1 and TC2. The above-described control voltage VCT is input to a gate of the transistor TC3. Further, a drain voltage of the transistor TC3 is output as the delay control signal PB, and a drain voltage of the transistor TC4 is output as the delay control signal NB.

For example, if the delay time in the delay circuit DCM becomes long and the phase of an output signal DLQ is delayed (if the relative phase difference with respect to the input signal DLI becomes large), the signal UP from the phase comparator 162 becomes the H level, and the control voltage VCT increases as shown in FIG. 8A. Then, as is clear from FIG. 8B, the voltage of the delay control signal PB decreases, and the voltage of the delay control signal NB increases. Thus, as is clear from FIG. 7, the bias current of the current control type inverter circuit that forms the delay units D0 to D359 increases, and a feedback control for decreasing the delay time in the delay circuit DCM is performed.

On the other hand, if the delay time in the delay circuit DCM decreases and the phase of the output signal DLQ advances (if the relative phase difference with respect to the input signal DLI becomes small), the signal DN from the phase comparator 162 becomes the H level, and the control voltage VCT decreases as shown in FIG. 8A. Then, as is clear from FIG. 8B, the voltage of the delay control signal PB increases, and the voltage of the delay control signal NB decreases. Thus, as is clear from FIG. 7, the bias current of the current control type inverter circuit decreases, and a feedback control for increasing the delay time in the delay circuit DCM is performed.

With such a feedback control, the phase difference between the input signal DLI and the output signal DLQ of the DLL circuit 150 is locked to, for example, 360 degrees. Thus, the phase delay of each of the 360 delay units D0 to D359 is locked to 1 degree.

In order to schematically illustrate the bias current that flows in the delay units D0 to D359, current sources ISP and ISN are shown in FIG. 6. However, as described above, in reality, the delay control signals PB and NB from the bias circuit 168 are input to the gates of the transistors TA1 and TA4 of the inverter circuit shown in FIG. 7, and thus, the bias current that flows in the delay units D0 to D359 is controlled.

Further, in FIG. 6, the adjustment circuit 130 includes a delay circuit DCF for fine phase adjustment and a delay circuit DCC for coarse phase adjustment (DCC1 and DCC2).

Here, the delay circuit DCF (second delay circuit) for the fine adjustment is configured by a delay unit DF with a small delay time compared with the delay units D0 to D359 that form the delay circuit DCM of the DLL circuit 150. For example, the delay unit DF is configured by a current control type inverter circuit as shown in FIG. 7, similar to the delay units D0 to D359. Here, for example, by setting or the like of the capacitance value of the capacitor CA or the transistor sizes of the transistors TA1 and TA4, for example, the delay unit DF is formed to have a delay time (0.5 step) corresponding to half the delay time (1 step) of the delay units D0 to D359.

Accordingly, when the phase delay of the delay units D0 to D359 is locked to 1 degree by the DLL circuit 150, the phase delay of the delay unit DF is fixed to 0.5 degrees. Accordingly, when using the delay circuit DCF having the delay unit DF, the fine phase adjustment of the step of 0.5 degrees can be performed. For example, if switches S5, S1, and S3 shown in FIG. 6 are turned on and the other switches (S2, S6, and S7) are turned off, the signal IN is input to the DLL circuit 150 as the signal DIN through the delay circuit DLI. Further, as the signal DLI is delayed by the delay circuit DCF, the signal DLI becomes a signal of which the phase is delayed by 0.5 degrees with respect to the signal IN.

Further, the delay circuit DCC1 (third delay circuit) is configured by delay units DG0 to DG29 of a number (30 steps) smaller than the number (360) of the delay units D0 to D359 that form the delay circuit DCM of the DLL circuit 150. Similarly, the delay circuit DCC2 (third delay circuit) is configured by delay units DH0 to DH29 of a number (30 steps) smaller than the number (360) of the delay units D0 to D359.

Further, the delay units DG0 to DG29 and DH0 to DH29 are configured by a current control type inverter circuit as shown in FIG. 7, and a delay time thereof is similarly set to the same delay time as in the delay units D0 to D359.

Accordingly, the coarse phase adjustment of the step of 30 degrees can be performed by each of the delay circuits DCC1 and DCC2. For example, if the switches S1, S6, S2, and S3 are turned on and the other switches are turned off, the signal DLI is delayed by the delay circuit DCC1, so that the signal DLI becomes a signal of which the phase is delayed by 30 degrees with respect to the signal IN. In addition, if the switches S1, S6, and S7 are turned on and the other switches are turned off, the signal DLI is delayed by the delay circuits DCC1 and DCC2, so that the signal DLI becomes a signal of which the phase is delayed by 60 degrees with respect to the signal IN.

Further, in FIG. 6, the output circuit 180 includes first, second, and third selectors 182, 184, and 186. The first selector 182 receives DL0 to DL29 corresponding to a first multi-phase clock signal group among the multi-phase clock signals (n=360 clock signals) from the DLL circuit 150, and outputs a first signal SLD0. The second selector 184 receives DL90 to DL119 corresponding to a second multi-phase clock signal group among the multi-phase clock signals from the DLL circuit 150, and outputs a second signal SLD90. The third selector 186 receives the first signal SLD0 and the second signal SLD90, and outputs the synchronization signal SYC.

Specifically, the selector 182 outputs a clock signal selected from the multi-phase clock signals DL0 to DL29 in the phase range of 30 degrees as the signal SLD0. The selector 184 outputs a clock signal selected from the multi-phase clock signals DL90 to DL119 in the phase range of 30 degrees as the signal SLD90. Further, the selector 186 selects any one of the signals SLD0 and SLD90, and outputs the selected signal as the synchronization signal SYC. That is, the output circuit 180 outputs the synchronization signal SYC based on m (m=60) multi-phase clock signals among n (n=360) multi-phase clock signals from the DLL circuit 150.

According to the above-described first configuration example, the clock signals DL0 to DL 29 and the clock signals DL90 to DL119 respectively corresponding to the continuous 30 steps can be selected from two positions of the delay circuit DCM (D0 to D359) configured by the 360 delay steps by the selectors 182 and 184. Accordingly, the phase selection can be performed in the range of 30 degrees.

Further, the delay circuits DCC1 and DCC2 configured by the 30 delay steps are provided at a preceding stage of the delay circuit DCM and can be selected by the switches. Accordingly, it is possible to output a phase delay signal of 0 degrees, 30 degrees or 60 degrees as the clock signal DL0. In addition, it is possible to output a phase delay signal of 90 degrees, 120 degrees or 150 degrees as the clock signal DL90.

For example, if only the switch S3 is turned on and the delay circuits DCC1 and DCC2 (and DCF) are in a non-selected state, a phase delay signal of 0 degrees is output as the clock signal DL0. Further, a phase delay signal in the range of 0 degrees to 29 degrees can be output as SLD0 by selection of the selector 182. In addition, a phase delay signal of 90 degrees is output as the clock signal DL90. Furthermore, a phase delay signal in the range of 90 degrees to 119 degrees can be output as SLD90 by selection of the selector 184.

Then, if only the switches S1, S6, S2, and S3 are turned on and the delay circuit DCC1 is in a selected state, a phase delay signal of 30 degrees is output as the clock signal DL0. Further, a phase delay signal in the range of 30 degrees to 59 degrees can be output as SLD0 by selection of the selector 182. In addition, a phase delay signal of 120 degrees is output as the clock signal DL90. Furthermore, a phase delay signal in the range of 120 degrees to 149 degrees can be output as SLD90 by selection of the selector 184.

Further, if only the switches S1, S6, and S7 are turned on and both the delay circuits DCC1 and DCC2 are in a selected state, a phase delay signal of 60 degrees is output as the clock signal DL0. Further, a phase delay signal in the range of 60 degrees to 89 degrees can be output as SLD0 by selection of the selector 182. In addition, a phase delay signal of 150 degrees is output as the clock signal DL90. Furthermore, a phase delay signal in the range of 150 degrees to 179 degrees can be output by selection of the selector 184.

Accordingly, the phase delay signal in the range of about 180 degrees (0 degrees to 179 degrees) can be output as the synchronization signal SYC. For example, as the selector 186 selects the signal SLD0, the phase delay signal in the range of 0 degrees to 89 degrees is output as the synchronization signal SYC, and as the selector 186 selects the signal SLD90, the phase delay signal in the range of 90 degrees to 179 degrees is output as the synchronization signal SYC. Accordingly, it is possible to perform the above-described wide range phase adjustment, and to increase the degree of freedom in evaluation, design or configuration of the detection device 20. For example, when evaluating the detection device 20, by variously changing the phase relationship between the detection signal and the synchronization signal, it is possible to evaluate the influence of the leakage signal on the detection performance or the like.

Further, in FIG. 6, the fine adjustment delay circuit DCF having the delay time of ½ and corresponding to the delay step of 0.5 steps is provided at a preceding stage of the delay circuit DCM, and can be selected by the switch. Accordingly, the phase delay signal of 0.5 degrees can be output as the synchronization signal SYC. For example, as described above, by combining this configuration with the method for outputting the phase delay signal in the range of 0 degrees to 179 degrees using the delay circuits DCC1 and DCC2 and the selectors 182, 184, and 186, the phase delay signal of a pitch of 0.5 degrees in the range of 0 degrees to 179 degrees can be output as the synchronization signal SYC. That is, the phase delay signal of the pitch of 0.5 degrees in the range of 0 degrees to 179 degrees, for example, 0 degrees, 0.5 degrees, 1 degree, 1.5 degrees, 2 degrees, . . . , 178 degrees, 178.5 degrees, or 179 degrees, can be output as the synchronization signal SYC. Accordingly, the above-described high resolution phase adjustment can be realized, and thus, the detection performance of the detection device 20 can be enhanced.

Further, by variably controlling the bias current supplied to the delay unit, it is possible to deal with the above-described wide range frequency. For example, in the bias circuit 168 shown in FIG. 8B, for example, by variably controlling the current that flows in the transistor TC3, the bias current that flows in the current control type inverter circuit that forms the delay unit can be variably controlled. Accordingly, it is possible to widen a frequency range to be handled. For example, the detection process or the like can be realized by the detection device 20 having the same circuit configuration, in either of a vibrator with a low drive frequency or a vibrator with a high drive frequency.

As described above, according to the present embodiment, the phase adjustment circuit capable of realizing all of the wide range phase adjustment (180 degree phase adjustment range), the high resolution phase adjustment (0.5 degree resolution), and the wide range frequency handling can be realized with low power consumption while reducing the increase of the circuit size to the minimum.

6. Second Configuration Example

Figure 9:
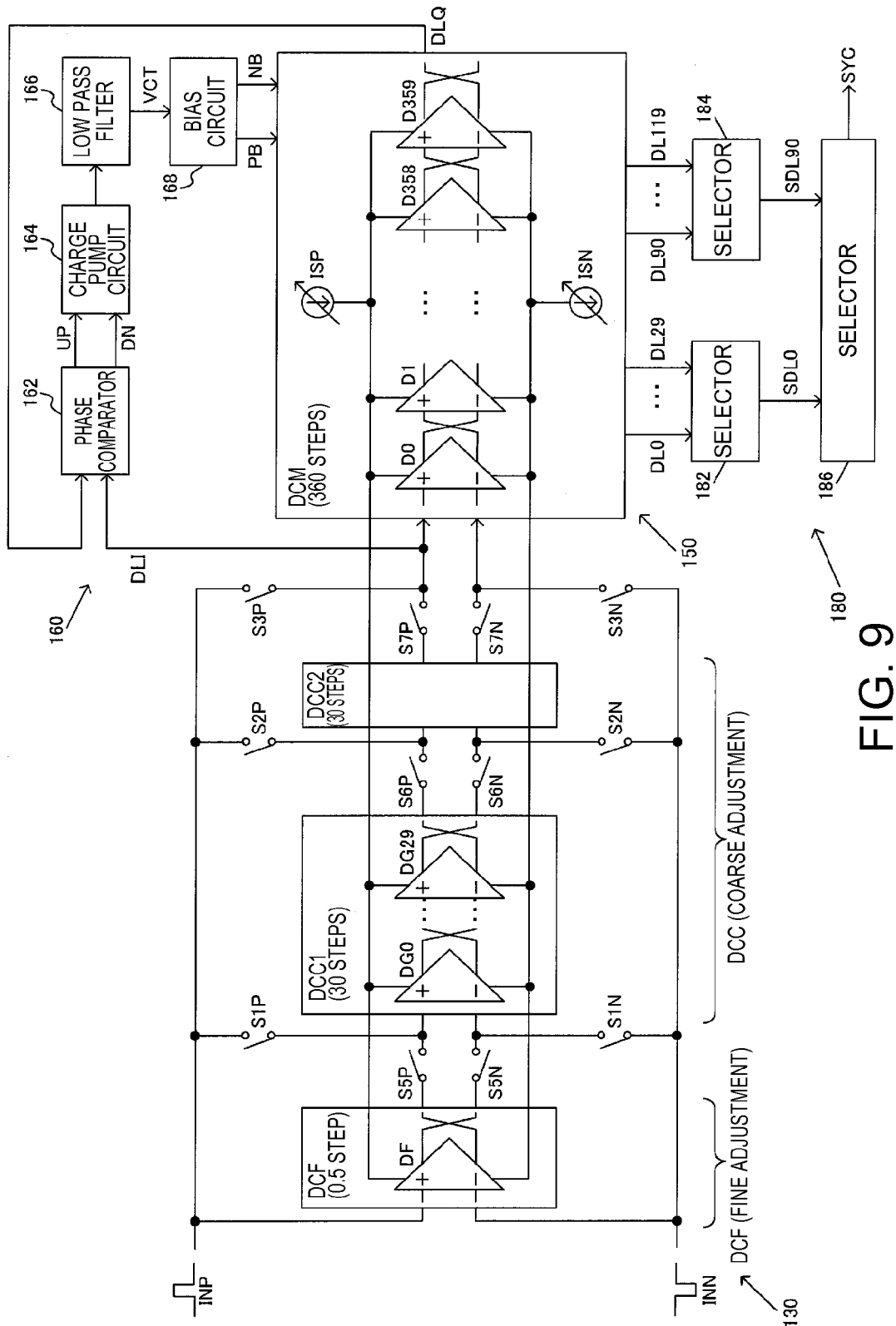
FIG. 9 is a diagram illustrating a detailed second configuration example of the synchronization signal output circuit.

FIG. 9 shows a detailed second configuration example of the synchronization signal output circuit 52 of the present embodiment. The second configuration example of FIG. 9 is different from the first configuration example of FIG. 6 in that the delay unit that forms the delay circuits DCM, DCF, DCC1, and DCC2 of the DLL circuit 150 and the adjustment circuit 130 is a differential type circuit having a differential input and a differential output (differential inverter circuit, differential amplifier circuit).

Figure 10:
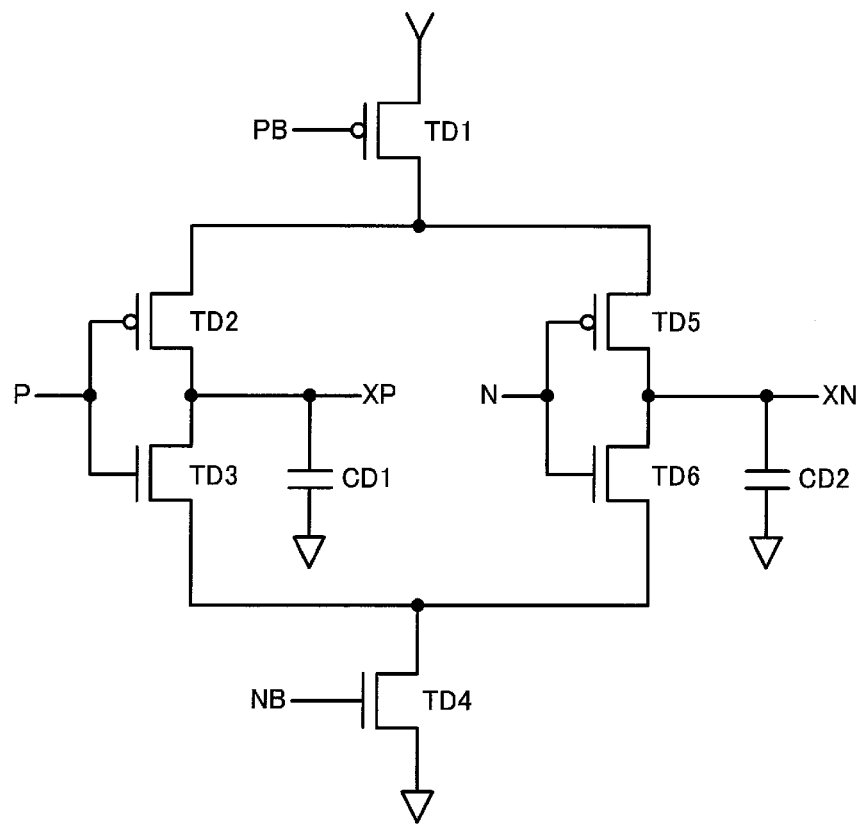
FIG. 10 is a diagram illustrating a configuration example of a differential type circuit that is an example of a delay unit.

FIG. 10 shows a specific circuit configuration example of the differential type circuit (full differential type circuit). The differential type circuit includes transistors TD1 to TD6, and capacitors CD1 and CD2. Delay control signals PB and NB are respectively input to gates of the P-type transistor TD1 and the N-type transistor TD4. Further, the transistors TD2 and TD3 that are serially connected, and the transistors TD5 and TD6 that are serially connected are connected in parallel between the transistors TD1 and TD4. In the differential type circuit, similar to the circuit shown in FIG. 7, the bias current can be controlled based on the delay control signals PB and NB, and the delay time can be controlled.

Gates of the transistors TD2 and TD3 function as a non-inverting input terminal (+) of the differential type circuit, and a signal P is input thereto. Gates of the transistors TD5 and TD6 function as an inverting input terminal (−), and a signal N is input thereto. Drains of the transistors TD2 and TD3 function as a non-inverting output terminal (+), and a signal XP is output therefrom. Drains of the transistors TD5 and TD6 function as an inverting output terminal (−), and a signal XN is output therefrom. Here, "X" means a negative logic.

For example, the signal XP output from the non-inverting output terminal of a differential type circuit at a preceding state (for example, D0 in FIG. 9) is input to the inverting input terminal of a differential type circuit (D1) at a subsequent stage as the signal N. The signal XN output from the inverting output terminal of a differential type circuit (D0) at a preceding stage is input to the non-inverting input terminal of a differential type circuit (D1) at a subsequent stage as the signal P.

For example, in order to realize appropriate synchronization detection, it is preferable that a duty ratio (ratio obtained by dividing a pulse width of a square wave by a pulse frequency) of the synchronization signal SYC be 50%.

In this regard, in the case of the circuit configuration shown in FIG. 7, if deviation of balance between the P-type transistor and the N-type transistor becomes large due to variation of the manufacturing process or the like, the duty ratio of the signal is deviated from 50% when the signal passes through the delay unit. The deviation of the duty ratio can be corrected by a wave shaping circuit to be described later. However, when the number of delay units of the delay circuit DCM is large, if the deviation of balance between the P-type transistor and the N-type transistor is large, the deviation from 50% of the duty ratio becomes extremely large. As a result, the phase comparison in the phase comparator 162 may not be performed, so that the lock function of the DLL circuit 150 may not work.

In this regard, according to the differential type circuit in FIG. 10, even though deviation occurs in balance of the P-type transistor and the N-type transistor due to variation of the manufacturing process or the like, it is possible to suppress the duty ratio of the signal from being deviated from 50% when the signal passes through the delay unit to the minimum. Accordingly, it is possible to maintain the duty ratio to be close to 50%, and to prevent the lock function of the DLL circuit 150 from improperly working.

7. Third Configuration Example

Figure 11:
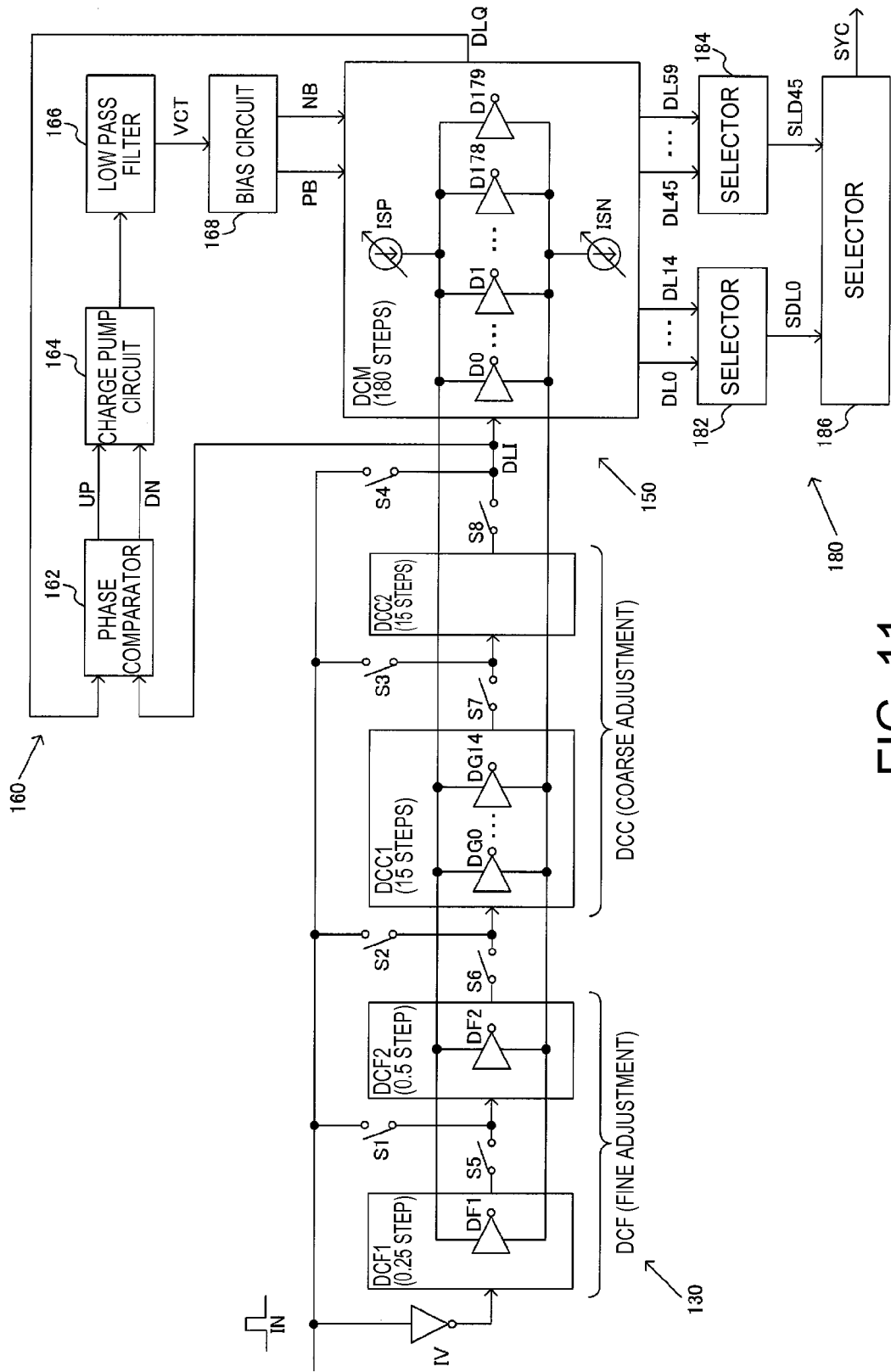
FIG. 11 is a diagram illustrating a detailed third configuration example of the synchronization signal output circuit.

FIG. 11 shows a detailed third configuration example of the synchronization signal output circuit 52 of the present embodiment. The third configuration example of FIG. 11 is different from the first configuration example of FIG. 6 in that the number of delay steps of the delay circuit DCM is 180. That is, the delay circuit DCM is configured by n (n=180) delay units D0 to D179 that are serially connected. Further, the selector 182 outputs a signal selected from multi-phase clock signals DL0 to DL14 as SDL0. The selector 184 outputs a signal selected from multi-phase clock signals DL45 to DL59 as SDL45. In addition, the selector 186 outputs any one of the signals SDL0 and SDL45 as the synchronization signal SYC.

Further, a delay circuit DCF1 including a delay unit DF1 of which a delay time is ¼ (0.25 steps) of the delay units D0 to D179 is provided as the fine adjustment delay circuit DCF of the adjustment circuit 130. In addition, a delay circuit DCF2 including a delay unit DF2 of which a delay time is ½ (0.5 steps) of the delay units D0 to D179 is provided. Further, the delay circuits DCC1 and DCC2 configured by 15 delay units are provided as the coarse adjustment delay circuit DCC of the adjustment circuit 130.

In FIG. 11, 180 delay units D0 to D179 are provided in the delay circuit DCM of the DLL circuit 150. Accordingly, the phase delay of each of the delay units D0 to D179 is locked to 2 degrees by the DLL circuit 150. Accordingly, fine phase adjustment of 0.5 degrees (2×0.25) can be performed by the delay circuit DCF1 having the delay unit DF1 of which the delay time is ¼. Further, fine phase adjustment of 1 degree (2×0.5) can be performed by the delay circuit DCF2 having the delay unit DF1 of which the delay time is ½. Accordingly, by combining these cases, the fine phase adjustment of 0.5 degrees, 1 degree and 1.5 degrees can be performed, for example.

Further, a signal of 0 degrees, 30 degrees, and 60 degrees can be output as the clock signal DL0, by the delay circuits DCC1 and DCC2 having 15 delay units. In addition, the phase selection in the range of 30 degrees can be performed by the selectors 182 and 184, or the like.

Accordingly, in the third configuration example, similarly, wide range phase adjustment, high resolution phase adjustment, and wide range frequency handling can be realized by a small circuit configuration with small current consumption.

8. Fourth Configuration Example

Figure 12:
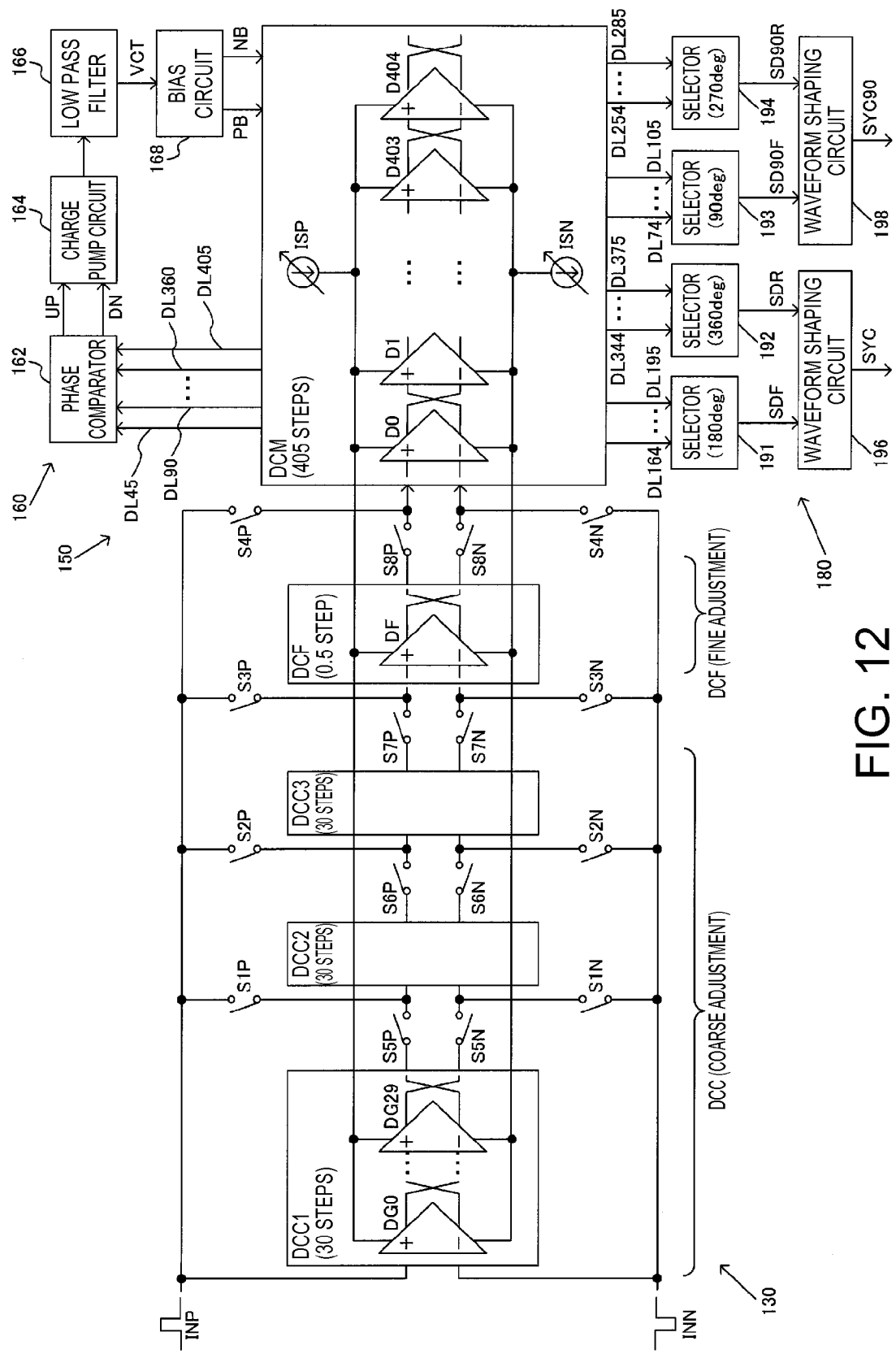
FIG. 12 is a diagram illustrating a detailed fourth configuration example of the synchronization signal output circuit.

FIG. 12 shows a detailed fourth configuration example of the synchronization signal output circuit 52 of the present embodiment. In the fourth configuration example, the differential type circuit of FIG. 10 is used as the delay unit. Further, the delay circuit DCM of the DLL circuit 150 includes delay units D0 to D404 that are serially connected.

Further, the adjustment circuit 130 includes the delay circuit DCF for fine adjustment provided at a preceding stage of the delay circuit DCM, and the delay circuit DCC for coarse adjustment provided at a preceding stage of the delay circuit DCF. The delay circuit DCF for fine adjustment includes a delay unit DF having a delay time of ½. The delay circuit DCC for coarse adjustment includes delay circuits DCC1, DCC2, and DCC3 configured by 30 delay units.

Further, the delay control circuit 160 of FIG. 12 generates delay control signals PB and NB using multi-phase clock signals DL45, DL90, DL135, DL180, DL225, DL270, DL315, DL360, and DL405 among multi-phase clock signals DL0 to DL405 of the DLL circuit 150. That is, the delay control circuit 160 performs phase comparison of j multi-phase clock signals among n multi-phase clock signals of the DLL circuit 150 to generate the delay control signals PB and NB. Further, the lock operation of the delay time is performed by the DLL circuit 150 so that the phase delay of each delay unit becomes 1 degree. Here, j and n are integers larger than 1, where j is smaller than n (j<n).

Further, the output circuit 180 includes a first selector 191 that receives first multi-phase clock signal groups DL164 to DL195 among the multi-phase clock signals from the DLL circuit 150 and outputs a first signal SDF. Further, the output circuit 180 includes a second selector 192 that receives second multi-phase clock signal groups DL344 to DL375 from the DLL circuit 150 and outputs a second signal SDR. Furthermore, the output circuit 180 includes a waveform shaping circuit 196 that outputs a synchronization signal SYC in which a falling edge is set by the first signal SDF and a rising edge is set by the second signal SDR.

Further, the output circuit 180 includes a third selector 193 that receives third multi-phase clock signal groups DL74 to DL105 from the DLL circuit 150 and outputs a third signal SD90F. In addition, the output circuit 180 includes a fourth selector 194 that receives fourth multi-phase clock signal groups DL254 to DL285 from the DLL circuit 150 and outputs a fourth signal SD90R. Furthermore, the output circuit 180 includes a waveform shaping circuit 198 that outputs a second synchronization signal SYC90 in which a falling edge is set by the third signal SD90F and a rising edge is set by the fourth signal SD90R.

That is, in the output circuit 180 of FIG. 12, the selector 191 selects the signal SDF for setting the falling edge of the synchronization signal SYC from DL164 to DL195. The selector 192 selects the signal SDR for setting the rising edge of the synchronization signal SYC from DL344 to DL375. Accordingly, by controlling the signal selection in the selectors 191 and 192, it is possible to freely set the duty ratio of the synchronization signal SYC. Thus, it is possible to set the duty ratio of the synchronization signal SYC to an ideal duty ratio, that is, 50%.

Further, the selector 193 selects the signal SD90F for setting the falling edge of the synchronization signal SYC90 from DL74 to DL105. In addition, the selector 194 selects the signal SD90R for setting the rising edge of the synchronization signal SYC90 from DL254 to DL285. Accordingly, by controlling the signal selection in the selectors 193 and 194, it is possible to freely set the duty ratio of the synchronization signal SYC90. Thus, it is possible to set the duty ratio of the synchronization signal SYC90 to the ideal duty ratio, that is, 50%.

Further, the synchronization signal SYC90 is a signal of which the phase advances by 90 degrees with respect to the synchronization signal SYC. In FIG. 12, a configuration in which the synchronization signals SYC and SYC90 can be simultaneously output is shown.

In addition, the synchronization signal SYC is set so that the phase can be set in the range of +16 degrees to 15 degrees with reference to the delay unit of the 360-th step, and the synchronization signal SYC90 is set so that the phase can be set in the range of +16 degrees to 15 degrees with reference to the delay unit of the 270-th step. These synchronization signals SYC and SYC90 are respectively set so that the phases and the duty ratios can be separately set.

Figure 13A:
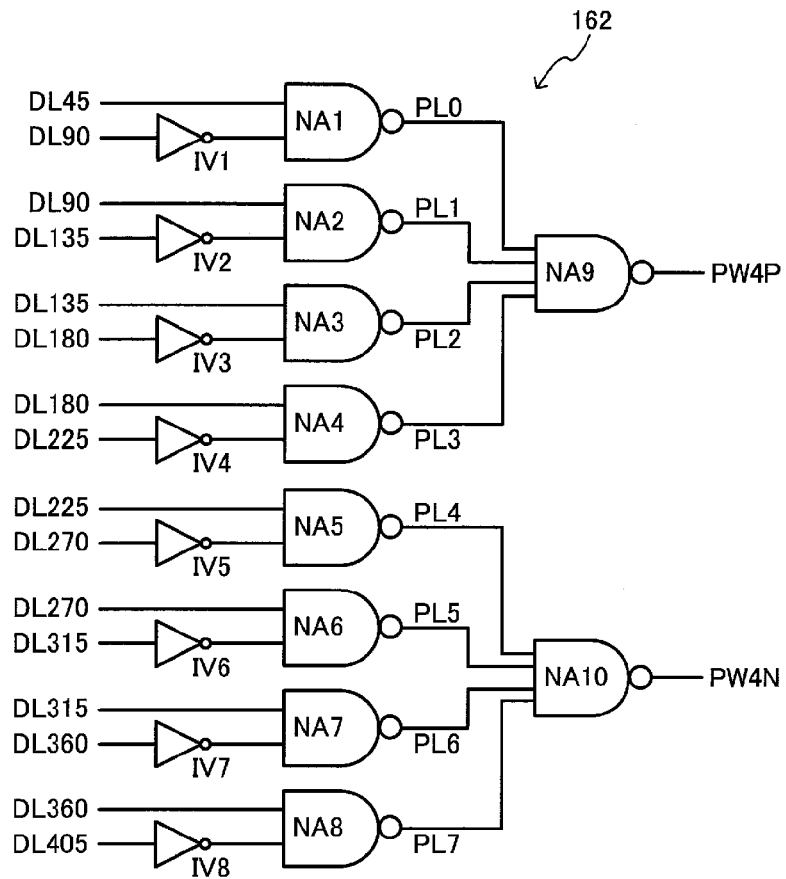
FIGS. 13A and 13B are diagrams illustrating configuration examples of the delay control circuit.
Figure 13B:
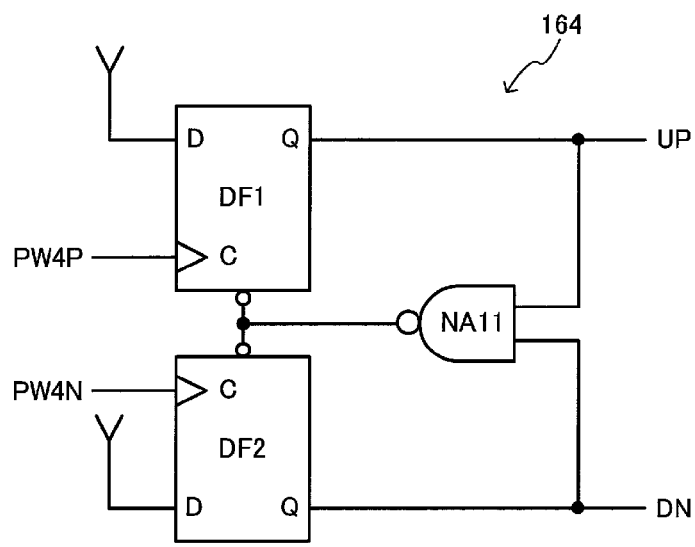

FIGS. 13A and 13B show configuration examples of the delay control circuit 160 in the fourth configuration example. FIG. 13A shows a configuration example of the phase comparator 162, and FIG. 13B shows a configuration example of the charge pump circuit 164.

As shown in FIG. 13A, the phase comparator 162 includes NAND circuits NA1 to NA10 and inverter circuits IV1 to IV8. Inverting signals of the clock signal DL45 and the clock signal DL90 are input to the NAND circuit NA1. Inverting signals of the clock signal DL90 and the clock signal DL135 are input to the NAND circuit NA2. Inverting signals of the clock signal DL135 and the clock signal DL180 are input to the NAND circuit NA3. In this way, in the phase comparator 162 of FIG. 13A, the clock signals are extracted with a phase pitch of 45 degrees, and the phases of two signals are compared by the NAND circuits NA1 to NA8. In this way, by performing the phase comparison of the plural clock signals, it is possible to prevent the DLL circuit 150 from performing pseudo locking at a delay time different from a desired delay time (frequency). For example, it is possible to prevent pseudo locking in which a delay time locked by the DLL circuit 150 becomes twice a desired delay time (in which the frequency is reduced to half).

Further, output signals PL0 to PL3 of the NAND circuits NA1 to NA4 are input to the NAND circuit NA9, and the NAND circuit NA9 outputs a signal PW4P. Output signals PL4 to PL7 of the NAND circuits NA5 to NA9 are input to the NAND circuit NA10, and the NAND circuit NA10 outputs a signal PW4N.

As shown in FIG. 13B, the charge pump circuit 164 includes D-type flip-flop circuits DF1 and DF2 and a NAND circuit NA11. The signals PW4P and PW4N from the phase comparator 162 shown in FIG. 13A are input to clock terminals of the flip-flop circuits DF1 and DF2. Data terminals of the flip-flop circuits DF1 and DF2 are set to an H level (high potential power source voltage). Output signals of the flip-flop circuits DF1 and DF2 are input to the NAND circuit NA11, and an output signal of the NAND circuit NA11 is input to reset terminals of the flip-flop circuits DF1 and DF2.

Figure 14:
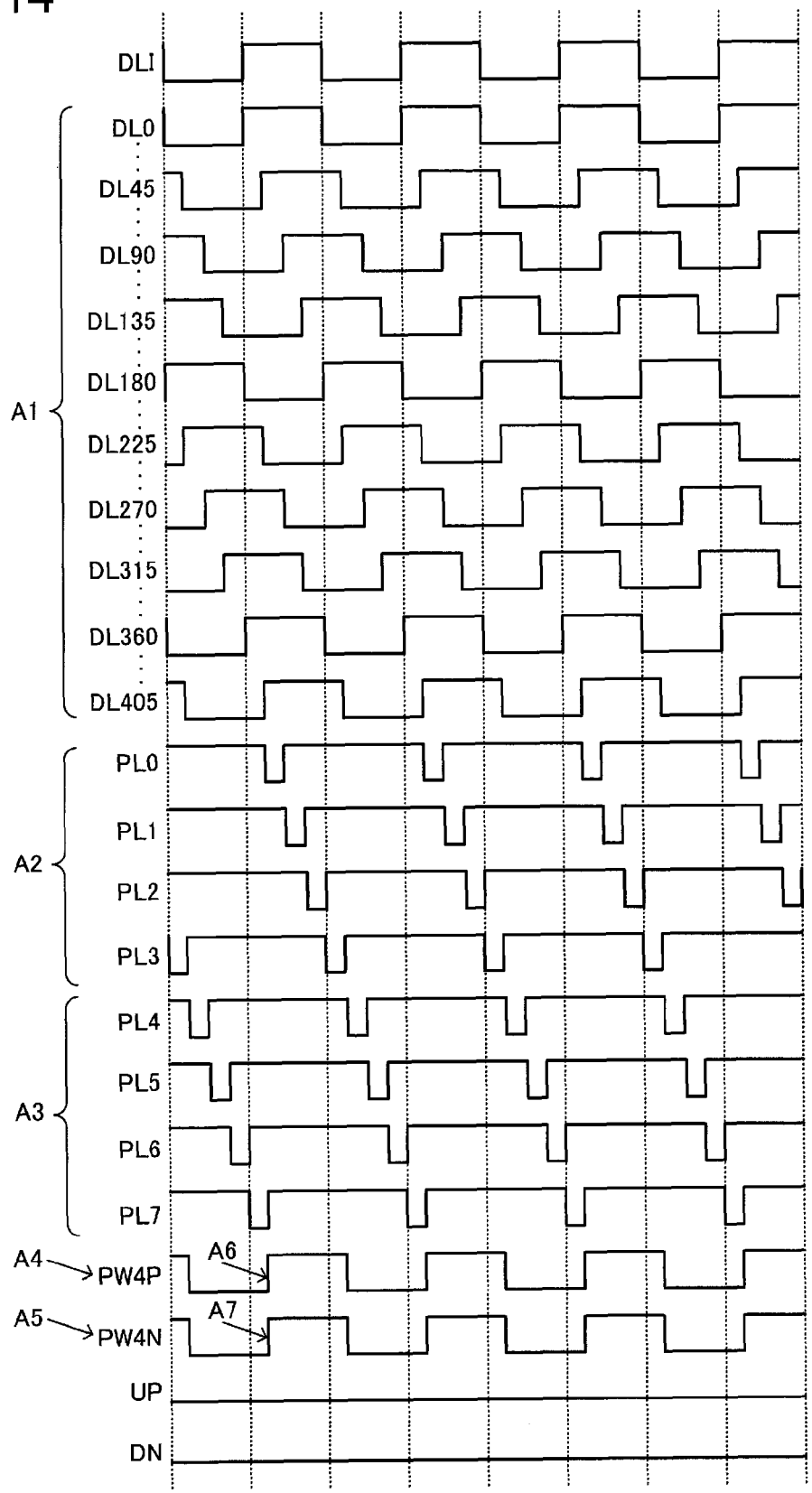
FIG. 14 is a diagram illustrating a signal waveform example for explaining an operation of the delay control circuit.

FIG. 14 is a diagram of a signal waveform example illustrating an operation of the delay control circuit 160 of the fourth configuration example. If the signal DLI is input to the delay circuit DCM, multi-phase clock signals indicated by A1 are generated. As the multi-phase clock signals are input to the NAND circuits NA1 to NA4 and NA5 to NA8, signals PL0 to PL3 indicated by A2 are output from the NAND circuits NA1 to NA4, and signals PL4 to PL7 indicated by A3 are output from the NAND circuits NA5 to NA8.

Further, as the signals PL0 to PL3 are input to the NAND circuit NA9, the signal PW4P indicated by A4 is generated. The signal PW4P corresponds to a signal obtained by a logic sum (OR) of the signals PL0 to PL3. Further, as the signals PL4 to PL7 are input to the NAND circuit NA10, the signal PW4N indicated by A5 is generated. The signal PW4N corresponds to a signal obtained by a logic sum of the signals PL4 to PL7.

If the delay time of the signal in the delay circuit DCM increases, a rising edge (for example, A6) of the signal PW4P rises prior to a rising edge (for example, A7) of the signal PW4N. As the signal PW4P rises prior to the signal PW4N, as shown in FIG. 13B, an output signal UP of the flip circuit DF1 of which the data terminal is set to the H level (high potential power source voltage) becomes an H level (active). Thus, a current that flows in the delay unit increases, and a feedback for shortening the delay time of the signal in the delay circuit DCM is caused.

On the other hand, if the delay time of the signal in the delay circuit DCM is shortened, the rising edge (A7) of the signal PW4N rises prior to the rising edge (A6) of the signal PW4P. As the signal PW4N rises prior to the signal PW4P, an output signal DN of the flip circuit DF2 of which the data terminal is set to the H level becomes an H level. Thus, the current that flows in the delay unit decreases, and a feedback for increasing the delay time of the signal in the delay circuit DCM is caused.

Figure 15:
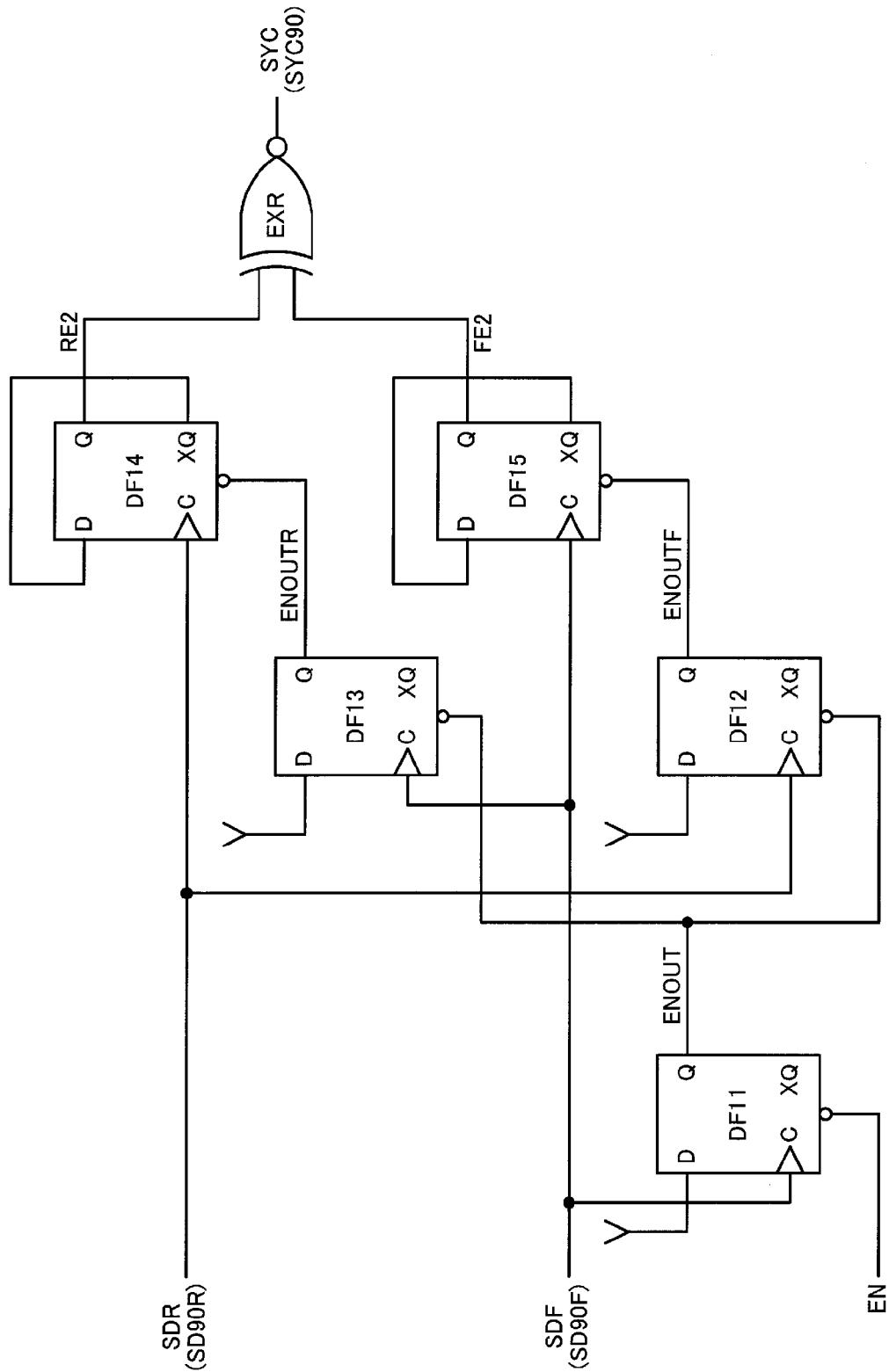
FIG. 15 is a diagram illustrating a configuration example of a waveform shaping circuit.
Figure 16A:
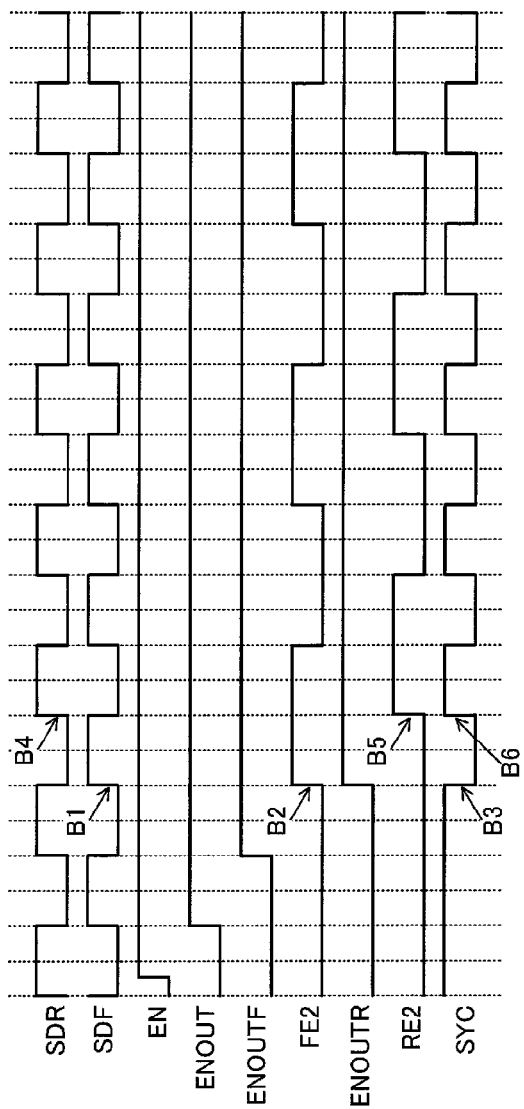
FIGS. 16A and 16B are diagrams illustrating signal waveform examples for explaining an operation of the waveform shaping circuit.
Figure 16B:
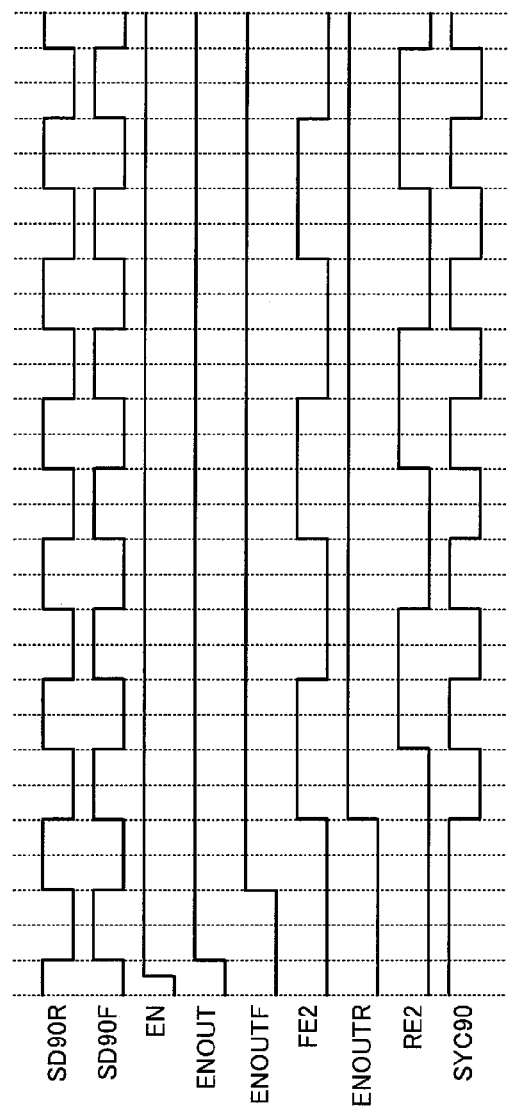

FIG. 15 is a diagram illustrating a configuration example of the waveform shaping circuit 196 in FIG. 12, and FIG. 16A is a signal waveform example illustrating an operation thereof. Since the waveform shaping circuit 198 has the same configuration as that of the waveform shaping circuit 196, a signal waveform example illustrating an operation thereof is shown in FIG. 16B, and detailed description thereof will not be repeated.

As shown in FIG. 15, the waveform shaping circuit 196 includes D-type flip-flops DF11 to DF15, and an exclusive OR circuit EXR.

As shown in the signal waveform example of FIG. 16A, after an enable signal EN becomes an H level, signals ENOUT and ENOUTF become an H level, and thus, a reset state of the flip-flop circuit DF15 is released. Thereafter, by the rising edge of the signal SDF indicated by B1, an output signal FE2 of the flip-flop circuit DF15 becomes an H level as indicated by B2, and the synchronization signal SYC becomes an L level as indicated by B3. That is, the falling edge of the synchronization signal SYC is set by the signal SDF output from the selector 191 shown in FIG. 12.

Further, as the signal SDF becomes the H level as indicated by B1, a signal ENOUTR becomes an H level, and a reset state of the flip-flop circuit DF14 is released. Then, by the rising edge of the signal SDF indicated by B4, an output signal RE2 of the flip-flop circuit DF14 becomes an H level as indicated by B5, and the synchronization signal SYC becomes an H level as indicated by B6. That is, the rising edge of the synchronization signal SYC is set by the signal SDR output from the selector 192 shown in FIG. 12.

By providing the waveform shaping circuit 196 with this configuration, it is possible to set the duty ratio of the synchronization signal SYC to 50%. That is, if the duty ratio of the synchronization signal SYC input to the synchronization detection circuit 81 is deviated from 50%, 1/f noise or the like is generated to cause an error in detection. Thus, for example, an error occurs in sensitivity, or zero drift occurs.

In this regard, if the waveform shaping circuit 196 of the present embodiment is provided, it is easy to set the duty ratio of the synchronization signal SYC to 50%, to thereby enhance the detection performance of the detection device 20.

9. Layout Arrangement

Figure 17:
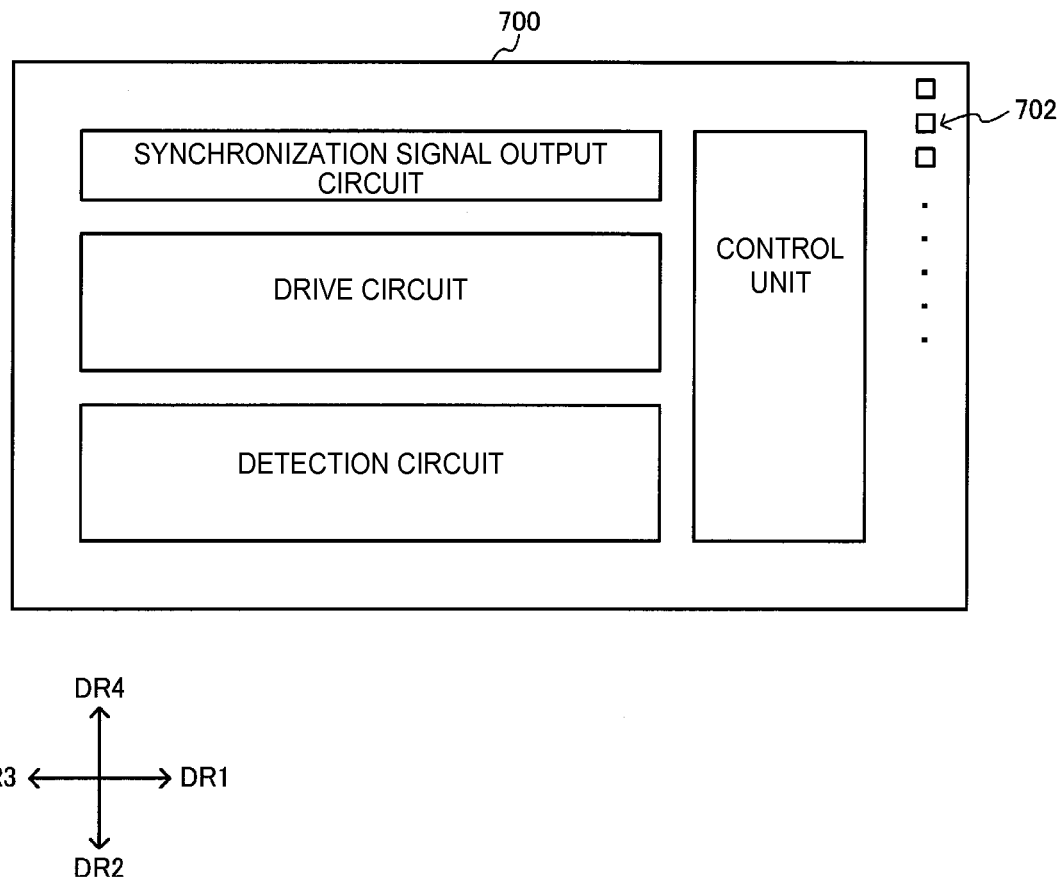
FIG. 17 is a diagram illustrating a layout arrangement example of the detection device.

FIG. 17 shows a layout arrangement example of a circuit when the detection device 20 of the present embodiment is realized by a semiconductor device 700.

As shown in FIG. 17, in the semiconductor device (semiconductor chip) 700, the synchronization signal output circuit 52, the drive circuit 30, the detection circuit 60, and the control unit 120 are layout-arranged. Further, in a region of an end portion of the semiconductor device 700, an I/O region (interface region) 702 is provided where a pad or an I/O circuit is arranged. An input signal or an output signal of the detection device is input or output through the I/O region 702.

In the semiconductor device 700, well regions (P well and N well), diffusion regions (P-type and N-type), a gate oxide film, an insulator film, a polysilicon layer, a metal interconnect layer, and the like are formed on a semiconductor substrate using a semiconductor process. Thus, transistors and signal lines of the synchronization signal output circuit, the drive circuit, the detection circuit, and the control unit are formed. FIG. 17 is a plan view when seen in a direction orthogonal to the semiconductor substrate.

In FIG. 17, a direction orthogonal to a first direction DR1 is represented as a second direction DR2, a direction opposite to the first direction DR1 is represented as a third direction DR3, and a direction opposite to the second direction DR2 is represented as a fourth direction DR4. The first direction DR1 is a direction from a first side of the rectangular semiconductor device 700 to a third side opposite to the first side. The second direction DR2 is a direction from a second side of the semiconductor device 700 to a fourth side opposite to the second side.

Further, in FIG. 17, the drive circuit is layout-arranged between the synchronization signal output circuit (phase adjustment circuit) and the detection circuit. That is, the drive circuit is arranged on the side of the second direction DR2 of the synchronization signal output circuit, and the detection circuit is arranged on the side of the second direction DR2 of the drive circuit. In addition, the control unit is arranged on the side of the first direction DR1 of the synchronization signal output circuit, the drive circuit, and the detection circuit. In FIG. 17, the synchronization signal output circuit, the drive circuit, the detection circuit, and the control unit show circuit arrangement regions where the transistors and the signal lines of these circuits are formed.

For example, in the circuit diagram (schematic view) of the detection device shown in FIG. 2, the synchronization signal output circuit 52 is arranged on the lower side of the drive circuit 30, and the detection circuit 60 is arranged on the lower side of the synchronization signal output circuit 52. That is, the signal from the drive circuit 30 is input to the synchronization signal output circuit 52, and the synchronization signal SYC from the synchronization signal output circuit 52 is input to the detection circuit 60. In FIG. 2, in order to follow the flow of the signals, the synchronization signal output circuit 52 is arranged on the lower side of the drive circuit 30, and the detection circuit 60 is arranged on the lower side of the synchronization signal output circuit 52.

On the other hand, in the present embodiment, in the layout arrangement of the semiconductor device 700 (arrangement such as an actual transistor on chip), unlike the flow of the signals in FIG. 2, the synchronization signal output circuit is arranged on the side of the fourth direction DR4 (upper side in the figure) of the drive circuit, and the detection circuit is arranged on the side of the second direction DR2 (lower side) of the drive circuit.

That is, as described with reference to FIG. 5 or the like, the plural delay units are provided in the delay circuit of the synchronization signal output circuit, and the lock operation of the delay time in the DLL circuit is performed. Accordingly, since the plural delay units are operated at the clock frequencies of the drive frequencies, digital noise of a high noise level may occur.

On the other hand, when detecting a desired signal in the detection circuit, since it is desired to perform detection of a high S/N ratio, it is preferable that a noise environment of an extremely low noise level be provided. Thus, if the synchronization signal output circuit that generates the digital noise having the high nose level is arranged close to the detection circuit, the S/N ratio in the detection process may deteriorate to cause reduction of the detection performance. In this regard, in the drive circuit, such an extremely low noise level environment as in the detection circuit is not necessary.

Thus, in FIG. 17, a layout method for arranging the synchronization signal output circuit and the detection circuit with the drive circuit being interposed therebetween is employed. With this configuration, it is possible to increase the distance between the synchronization signal output circuit and the detection circuit. Thus, it is possible to prevent the digital noise generated in the synchronization signal output circuit from being transmitted to the detection circuit. Accordingly, it is possible to suppress the performance of the detection circuit from deteriorating due to the digital noise of the synchronization signal output circuit.

Further, in FIG. 17, for example, the width of the synchronization signal output circuit is determined and arranged to match the width of the drive circuit or the detection circuit in the first direction DR1. With this configuration, the overall layout efficiency in the semiconductor device 700 can be enhanced. Accordingly, the chip area of the semiconductor device 700 can be reduced, to thereby reduce the cost, for example.

In addition, in FIG. 17, the control unit is arranged on the side of the first direction DR1 of the synchronization signal output circuit, the drive circuit, and the detection circuit. According to such a layout arrangement, it is possible to connect the interconnects for the output signal from the control unit or the input signal to the control unit to the synchronization signal output circuit, the drive circuit, and the detection circuit on short paths. Thus, it is possible to enhance the layout efficiency, to thereby reduce the size of the semiconductor device 700.

Figure 18:
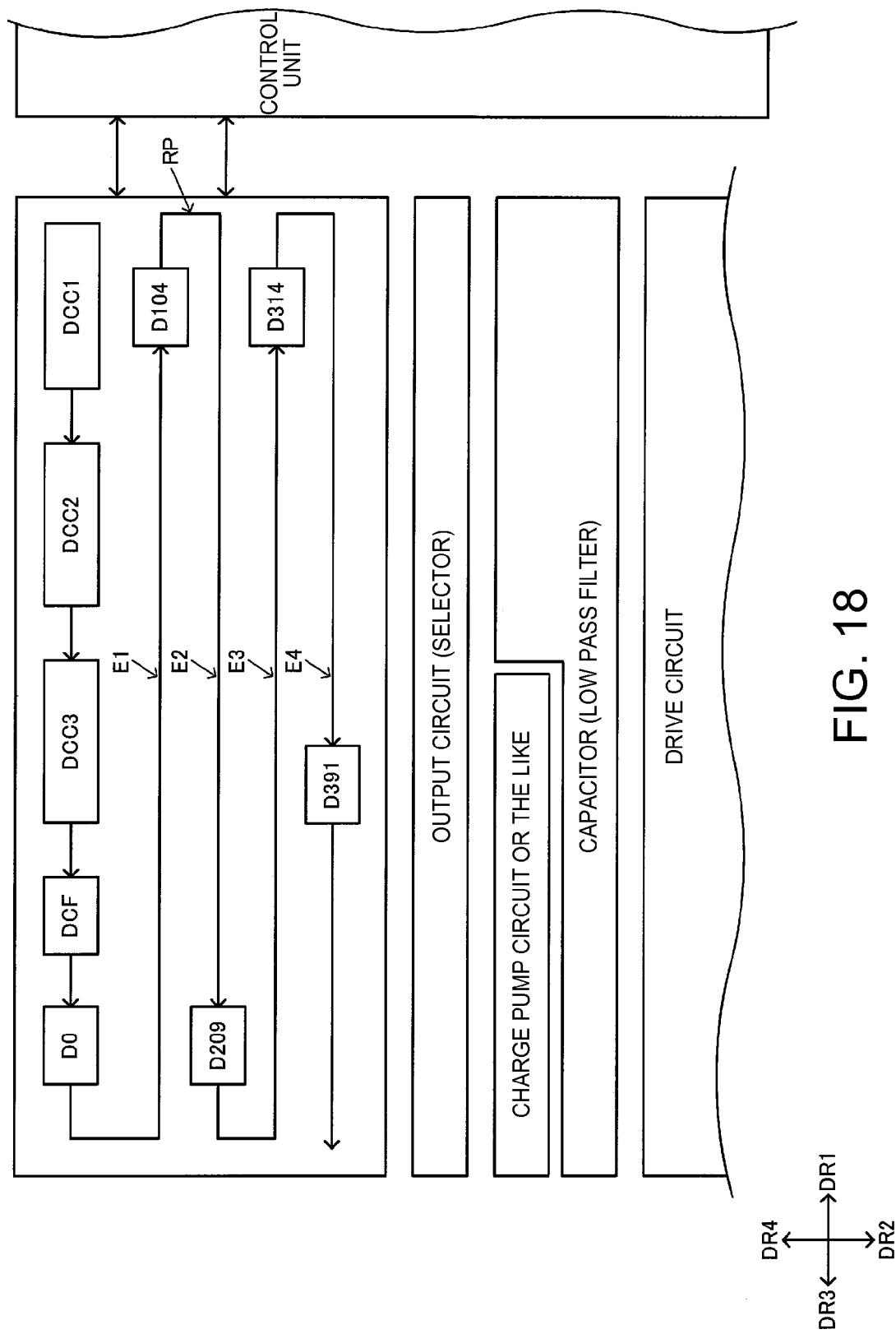
FIG. 18 is a diagram illustrating a layout arrangement example of the synchronization signal output circuit.

FIG. 18 is a diagram illustrating a detailed layout arrangement example of the synchronization signal output circuit. In FIG. 18, the input signal to the synchronization signal output circuit is transmitted while being delayed by the delay units of the delay circuits DCC1, DCC2, DCC3, and DCF shown in FIG. 12, and is then input to the delay circuit DCM. Further, the input signal is transmitted while being delayed by the delay units D0, D1, . . . , D404 of the delay circuit DCM.

In this case, a first delay unit group among the plural delay units D0 to D404 of the delay circuit DCM of the DLL circuit 150 is arranged so that a direction from an input side of each delay unit to an output side thereof is along the first direction DR1 as indicated by E1. That is, the delay units of the first delay unit group are arranged to be serially connected in the first direction DR1 as indicated by E1.

Further, a second delay unit group subsequent to the first delay unit group is arranged on the side of the second direction DR2 of the first delay unit group as indicate by E1, as indicated by E2. Here, the second delay unit group is arranged so that a direction from an input side of each delay unit to an output side thereof is along the third direction DR3, as indicated by E2. That is, the delay units of the second delay unit group are arranged to be serially connected along the third direction DR3, as indicated by E2.

Further, a third delay unit group subsequent to the second delay unit group is arranged on the side of the second direction DR2 of the second delay unit group as indicated by E2, as indicated by E3. Here, the third delay unit group is arranged so that a direction from an input side of each delay unit to an output side thereof is along the first direction DR1, as indicated by E3.

Further, a fourth delay unit group subsequent to the third delay unit group is arranged on the side of the second direction DR2 of the third delay unit group as indicated by E3, as indicated by E4. Here, the fourth delay unit group is arranged so that a direction from an input side of each delay unit to an output side thereof is along the third direction DR3, as indicated by E4.

In this way, in FIG. 18, the first delay unit group of the DLL circuit is arranged along the first direction DR1, as indicated by E1, and the subsequent second delay unit group is arranged along the third direction DR3 opposite to the first direction DR1 as indicated by E2. Further, the third delay unit group is arranged along the first direction DR1 as indicated by E3, and the subsequent fourth delay unit group is arranged along the third direction DR3 as indicated by E4.

By performing the layout arrangement in this way, it is possible to enhance the layout efficiency of the delay units, to thereby reduce the size of the layout area of the synchronization signal output circuit.

Further, by arranging the plural delay units as shown in FIG. 18, it is possible to employ a method for performing layout arrangement so that the width of the synchronization signal output circuit in the first direction DR1 matches the width of the drive circuit or the detection circuit in the first direction DR1, to thereby enhance the layout efficiency.

For example, by performing design of an analog circuit or the like, a circuit configuration of the drive circuit or the detection circuit is determined, and a layout arrangement pattern of the drive circuit or the detection circuit is determined. Further, the drive circuit and the detection circuit shown in FIG. 17 are layout-arranged using the determined layout pattern.

Then, when layout-arranging the synchronization signal output circuit, the width of the synchronization signal output circuit is determined to match (approximately match) the width of the drive circuit or the detection circuit in the first direction. That is, in FIG. 18, by adjusting a bending point in the arrangement of the plural delay units, the width of the synchronization signal output circuit matches the width of the drive circuit or the detection circuit. For example, by determining the delay unit which is arranged at the bending point RP of the first delay unit group indicated by E1 and the second delay unit group indicated by E2, the width of the synchronization signal output circuit can be adjusted.

With this configuration, the synchronization signal output circuit having the same width as the width of the drive circuit can be layout-arranged in the region on the side of the fourth direction DR4 of the drive circuit in FIG. 17. Accordingly, the overall layout efficiency of the detection device can be enhanced, to thereby reduce the size and cost of the semiconductor device 700.

Further, in FIG. 18, the output circuit 180 configured by the selectors and the like is arranged on the side of the second direction DR2 of the plural delay units D0 to D404 of the DLL circuit. With this configuration, the efficiency of layout interconnects of the multi-phase clock signals input to the output circuit from the plural delay units of the DLL circuit can be enhanced, to thereby reduce the size of the layout area of the synchronization signal output circuit. For example, signal lines of clock signals DL164 to DL195, DL344 to DL375, DL74 to DL105, and DL254 to DL285 shown in FIG. 12 are layout-arranged so as not to overlap each other, and are connected to the selectors 191, 192, 193, and 194 of the output circuit 180. Thus, it is possible to prevent the layout area of the synchronization signal output circuit from increasing due to increase of the interconnect area of the signal lines. As shown in FIG. 18, on the side of the second direction DR2 of the output circuit, the charge pump circuit, the capacitors of the low pass filter, and the like are layout-arranged.

10. Detection Circuit

Figure 19:
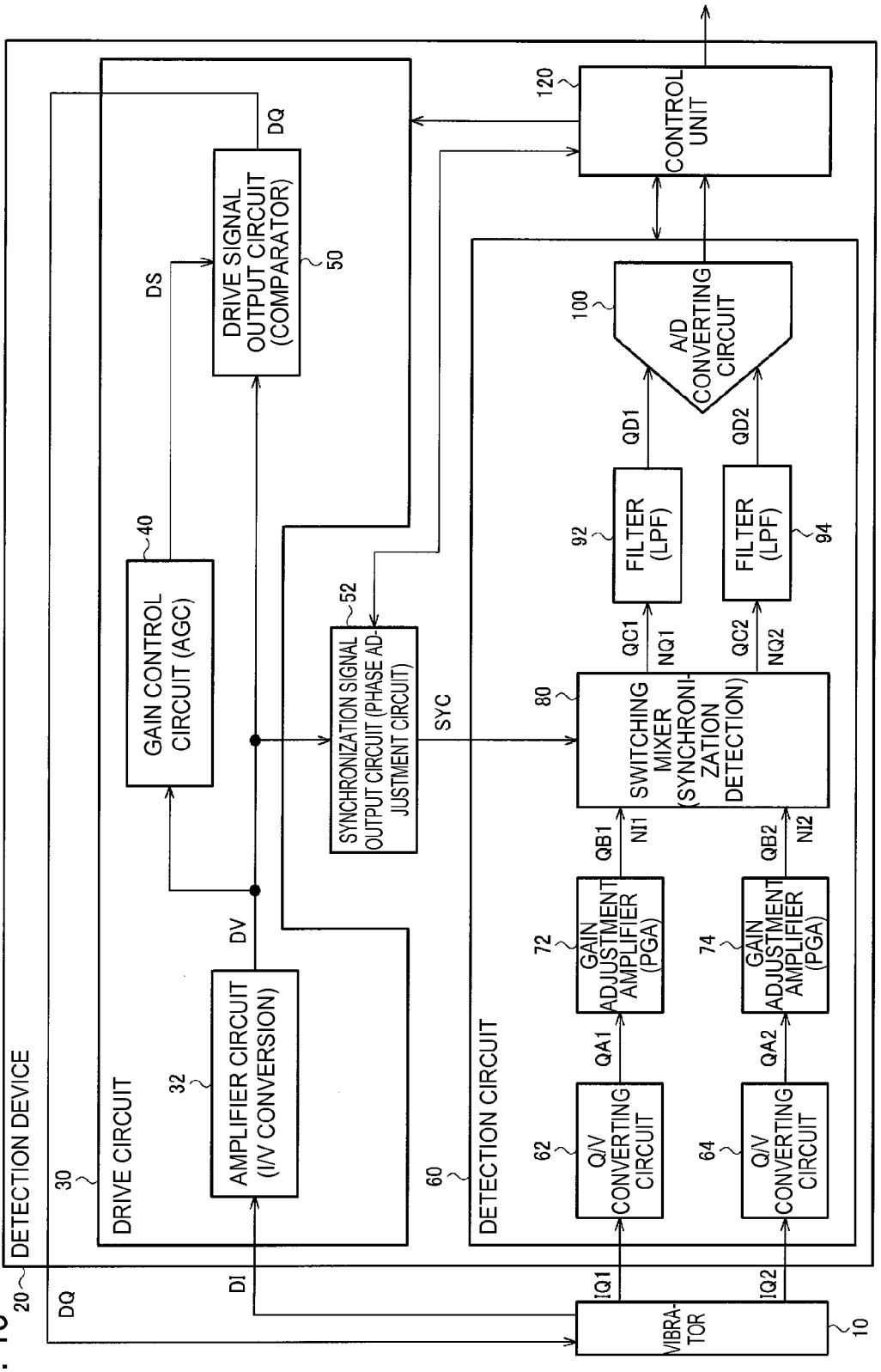
FIG. 19 is a diagram illustrating a configuration example of a detection device of a full differential switching mixer type.

FIG. 19 shows a detailed configuration example of the detection circuit 60. FIG. 19 is an example of the detection circuit 60 of a full differential switching mixer type.

The detection circuit 60 includes first and second Q/V converting circuits 62 and 64, first and second gain adjustment amplifiers 72 and 74, a switching mixer 80, first and second filters 92 and 94, and an A/D converting circuit 100. The detection circuit 60 is not limited to the configuration shown in FIG. 19, and various modifications such as an omission of a part of the components or an addition of other components may be made.

First and second differential detection signals IQ1 and IQ2 from the vibrator 10 are input to the Q/V converting circuits 62 and 64 (charge-voltage converting circuit). Further, the Q/V converting circuits 62 and 64 convert electric charges (current) generated in the vibrator 10 into voltage. The Q/V converting circuits 62 and 64 are continuous charge-voltage converting circuits having a feedback resistance.

The gain adjustment amplifiers 72 and 74 adjust gains of output signals QA1 and QA2 of the Q/V converting circuits 62 and 64 for amplification. The gain adjustment amplifiers 72 and 74 are so-called programmable gain amplifiers, and amplify the signals QA1 and QA2 using set gains. For example, the gain adjustment amplifiers 72 and 74 amplify the signals QA1 and QA2 to signals having amplitude suitable for a voltage converting range of the A/D converting circuit 100.

The switching mixer 80 is a mixer that performs differential synchronization detection based on the synchronization signal SYC from the drive circuit 30. Specifically, in the switching mixer 80, an output signal QB1 of the gain adjustment amplifier 72 is input to a first input node NI1, and an output signal QB2 of the gain adjustment amplifier 74 is input to a second input node NI2. Further, the switching mixer 80 performs differential synchronization detection using the synchronization signal SYC from the drive circuit 30, and outputs first and second differential output signals QC1 and QC2 through first and second output nodes NQ1 and NQ2. An unnecessary signal such as noise (1/f noise) generated by the circuits (Q/V converting circuit, gain adjustment amplifier) at the preceding stages is frequency-converted into a high frequency band by the switching mixer 80. Further, a desired signal that is a signal based on a Coriolis force is dropped down into a DC signal.

The first output signal QC1 from the first output node NQ1 of the switching mixer 80 is input to the filter 92. The second output signal QC2 from the second output node NQ2 of the switching mixer 80 is input to the filter 94. These filters 92 and 94 are low pass filters having a frequency characteristic of removing (attenuating) an unnecessary signal and transmitting a desired signal. For example, the unnecessary signal such as 1/f noise frequency-converted into the high frequency band by the switching mixer 80 is removed by the filters 92 and 94. Further, the filters 92 and 94 are passive filters configured by a passive element, for example. That is, as the filters 92 and 94, a passive filter configured by a passive element such as a resistance element or a capacitor may be employed without using an operational amplifier.

The A/D converting circuit 100 receives an output signal QD1 from the filter 92 and an output signal QD2 from the filter 94, and performs differential A/D conversion. Specifically, the A/D converting circuit 100 performs sampling of the output signals QD1 and QD2 using the filters 92 and 94 as an anti-aliasing filter (introduction filter) to perform the A/D conversion. Further, in the present embodiment, the output signal QD1 from the filter 92 and the output signal QD2 from the filter 94 are input to the A/D converting circuit 100 without through an active element.

As the A/D converting circuit 100, an A/D converting circuit of various types such as a delta-sigma type or a successive approximation type may be employed, for example. When employing the delta-sigma type, for example, an A/D converting circuit that has a function of correlated double sampling (CDS), a chopper or the like for reduction of 1/f noise and is configured by a secondary delta-sigma converter or the like may be used. Further, when employing the successive approximation type, for example, an A/D converting circuit that has a function of dynamic element matching (DEM) that reduces deterioration of the S/N ratio due to element variation of the DAC and is configured by a capacitance DAC and a successive approximation control logic may be used.

The control unit 120 performs a variety of digital signal processing. For example, the control unit 120 performs band limit digital filtering based on an application of a desired signal or digital filtering for removing noise generated by the A/D converting circuit 100 or the like. Further, the control unit 120 performs digital correction such as gain correction (sensitivity adjustment) or offset correction.

In the detection device 20 shown in FIG. 19, the full differential switching mixer type is employed. According to the full differential switching mixer type, the 1/f noise or the like generated by the Q/V converting circuits 62 and 64, or the gain adjustment amplifiers 72 and 74 is removed by the frequency conversion in the switching mixer 80 and the low pass filter characteristic of the filters 92 and 94. Further, between the gain adjustment amplifiers 72 and 74 and the A/D converting circuit 100, the switching mixer 80 where the gain does not work but the 1/f noise is not generated and the filters 92 and 94 configured by a passive element with low noise are provided. Accordingly, since the noise generated by the Q/V converting circuits 62 and 64 or the gain adjustment amplifiers 72 and 74 is removed and the noise generated by the switching mixer 80 or the filters 92 and 94 is suppressed to the minimum, the signals QD1 and QD2 in a low noise state can be input to the A/D converting circuit 100 for A/D conversion. Furthermore, since the signals QD1 and QD2 can be A/D converted as the differential signals, the S/N ratio can be enhanced compared with a case where A/D conversion is performed using a single ended signal.

Particularly, in the full differential switching mixer type, it is important to set the duty ratio of the synchronization signal SYC input to the switching mixer 80 to 50%. If the duty ratio is deviated from 50%, the detection performance extremely deteriorates due to the 1/f noise or the like. In this regard, according to the synchronization signal output circuit 52 of the present embodiment, for example, by providing the waveform shaping circuits 196 and 198 as shown in FIG. 12, it is possible to perform adjustment so that the duty ratio of the synchronization signal SYC is set to 50%. Accordingly, it is possible to enhance the detection performance in the full differential switching mixer type detection device 20.

The detection device 20 of the present embodiment is not limited to the configuration of the full differential switching mixer type as shown in FIG. 19. For example, various configurations such as a direct sampling type configured by a discrete type Q/V converting circuit and an A/D converting circuit directly connected to the discrete type Q/V converting circuit may be employed.

Figure 20:
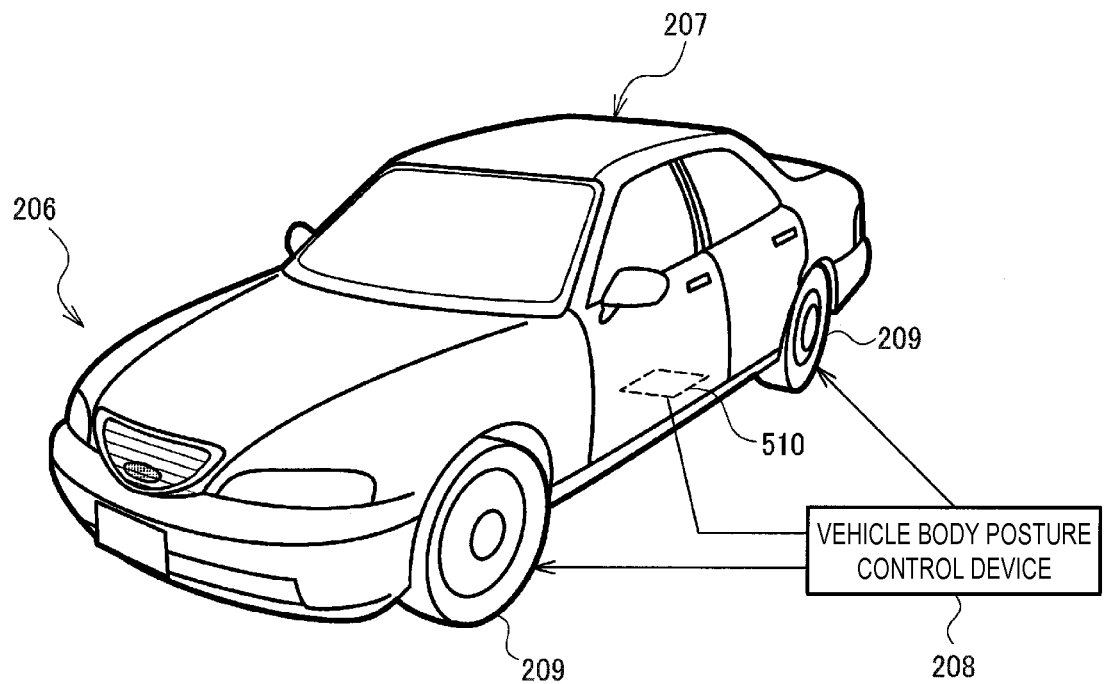
FIG. 20 is a diagram illustrating an example of a moving object to which the detection device of the present embodiment is applied.

FIG. 20 shows an example of a moving object including the detection device 20 of the present embodiment. The detection device 20 of the present embodiment may be assembled to various moving objects such as a vehicle, an airplane, a motorbike, a bicycle or a ship. The moving object is a device that includes a driving mechanism such as an engine or a motor, a steering mechanism such as a steering wheel or a rudder, and various electronic devices, and moves on the ground, the sky or the sea. FIG. 20 schematically shows an automobile 206 as a specific example of the moving object. The automobile 206 is provided with a gyro sensor 510 (sensor) that includes the vibrator 10 and the detection device 20. The gyro sensor 510 may detect the posture of a vehicle body 207. A detection signal of the gyro sensor 510 may be provided to a vehicle body posture control device 208. The vehicle body posture control device 208 may control hardness of a suspension according to the posture of the vehicle body 207, or may control a brake of each vehicle wheel 209, for example. Further, this posture control may be used in various moving objects such as a bipedal walking robot, a flying machine or a helicopter. In order to realize the posture control, the gyro sensor 510 may be assembled.

Hereinabove, embodiments of the invention have been described in detail, but it can be easily understood to those skilled in the art that various modifications can be made in a range without substantially departing from the novel contents and effects of the invention. Accordingly, such modifications should be construed to be included in the scope of the invention. For example, in the description and the drawings, a term (vibrator, gyro sensor, angular velocity or the like) written at least one time together with a different term (physical quantity transducer, sensor, physical quantity or the like) having a broader meaning or the same meaning can be exchanged with the different term in any location in the description and the drawings. Further, the configuration of the detection device, the sensor, the electronic apparatus, and moving object, and the structure of the vibrator are not limited to the above-described embodiments, and various modifications may be realized.

The entire disclosure of Japanese Patent Application No. 2013-255325 filed Dec. 10, 2013 is expressly incorporated by reference herein.

What is claimed is:

1. A detection device comprising:
a drive circuit that receives a feedback signal from a physical quantity transducer and drives the physical quantity transducer;
a synchronization signal output circuit that receives an output signal from the drive circuit and outputs a synchronization signal; and
a detection circuit that performs detection of a physical quantity signal corresponding to a physical quantity based on a signal from the physical quantity transducer and the synchronization signal and outputs detection data,
wherein the synchronization signal output circuit includes:
a delay locked loop circuit that includes:
a delay control circuit that outputs a delay control signal, and
a delay circuit that includes a plurality of delay units in which a delay time is controlled by the delay control signal,
an adjustment circuit that includes at least one delay unit in which a delay time is controlled by the delay control signal, and outputs a signal obtained by delaying an input signal based on the output signal from the drive circuit to the delay locked loop circuit, and
an output circuit that outputs the synchronization signal based on multi-phase clock signals from the delay locked loop circuit.

2. The detection device according to claim 1, wherein the adjustment circuit includes a second delay circuit that is configured by a delay unit having a delay time shorter than that of each of the plurality of delay units that form the delay circuit of the delay locked loop circuit.

3. A sensor comprising:
the detection device according to claim 2; and
the physical quantity transducer.

4. An electronic apparatus comprising the detection device according to claim 2.

5. A moving object comprising the detection device according to claim 2.

6. The detection device according to claim 1, wherein the adjustment circuit includes another delay circuit configured by fewer delay units that the plurality of delay units that form the delay circuit of the delay locked loop circuit.

7. The detection device according to claim 1, wherein the output circuit outputs the synchronization signal based on m multi-phase clock signals among n multi-phase clock signals from the delay locked loop circuit, m and n are integers larger than 1, and m is less than n.

8. The detection device according to claim 1, wherein the output circuit includes:
a first selector that receives a first multi-phase clock signal group among the multi-phase clock signals from the delay locked loop circuit and outputs a first signal,
a second selector that receives a second multi-phase clock signal group among the multi-phase clock signals from the delay locked loop circuit and outputs a second signal, and
a third selector that receives the first signal and the second signal, and outputs the synchronization signal.

9. The detection device according to claim 1, wherein the output circuit includes:
a first selector that receives a first multi-phase clock signal group among the multi-phase clock signals from the delay locked loop circuit and outputs a first signal,
a second selector that receives a second multi-phase clock signal group among the multi-phase clock signals from the delay locked loop circuit and outputs a second signal, and
a waveform shaping circuit that outputs the synchronization signal having a falling edge set by the first signal and a rising edge set by the second signal.

10. The detection device according to claim 9, wherein the output circuit further includes:
a third selector that receives a third multi-phase clock signal group among the multi-phase clock signals from the delay locked loop circuit and outputs a third signal,
a fourth selector that receives a fourth multi-phase clock signal group among the multi-phase clock signals from the delay locked loop circuit and outputs a fourth signal, and
a second waveform shaping circuit that outputs a second synchronization signal having a falling edge set by the third signal and a rising edge set by the fourth signal.

11. The detection device according to claim 1, wherein the delay control circuit compares phases of an input signal and an output signal of the delay locked loop circuit to generate the delay control signal.

12. The detection device according to claim 1, wherein the delay control circuit performs phase comparison of j multi-phase clock signals among n multi-phase clock signals of the delay locked loop circuit to generate the delay control signal, n and j are integers larger than 1, and j is less than n.

13. The detection device according to claim 1, wherein each delay unit that forms the delay locked loop circuit and the adjustment circuit is a differential circuit having a differential input and a differential output.

14. The detection device according to claim 1, wherein a second direction is orthogonal to a first direction,
a third direction is opposite to the first direction,
a first delay unit group among the plurality of delay units of the delay locked loop circuit is arranged so that a direction from an input side of each delay unit to an output side thereof is along the first direction, and
a second delay unit group subsequent to the first delay unit group is arranged on the second direction side of the first delay unit group, and is arranged so that a direction from an input side of each delay unit to an output side thereof is along the third direction.

15. A sensor comprising:
the detection device according to claim 1; and
the physical quantity transducer.

16. An electronic apparatus comprising the detection device according to claim 1.

17. A moving object comprising the detection device according to claim 1.

18. A detection device comprising:
a drive circuit that receives a feedback signal from a physical quantity transducer and drives the physical quantity transducer;
a synchronization signal output circuit that receives an output signal from the drive circuit and outputs a synchronization signal; and
a detection circuit that performs detection of a physical quantity signal corresponding to a physical quantity based on a signal from the physical quantity transducer and the synchronization signal and outputs detection data,
wherein the synchronization signal output circuit includes:
  a delay locked loop circuit that includes:
    a delay control circuit that outputs a delay control signal, and
    a delay circuit that includes a plurality of delay units in which a delay time is controlled by the delay control signal,
  an adjustment circuit that includes at least one delay unit in which a delay time is controlled by the delay control signal, wherein the adjustment circuit is provided outside a loop of the delay locked loop circuit, and adjusts a phase of the synchronization signal, and
  an output circuit that outputs the synchronization signal based on multi-phase clock signals from the delay locked loop circuit.

* * * * *